United States Patent
Suzuki et al.

(10) Patent No.: US 12,317,723 B2
(45) Date of Patent: *May 27, 2025

(54) DISPLAY PANEL, DISPLAY DEVICE, INPUT/OUTPUT DEVICE, AND DATA PROCESSING DEVICE

(71) Applicant: Semiconductor Energy Laboratory Co., Ltd., Kanagawa-ken (JP)

(72) Inventors: Tsunenori Suzuki, Kanagawa (JP); Yasuhiro Niikura, Tokyo (JP); Tomoya Hirose, Kanagawa (JP); Satoshi Seo, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/436,671

(22) Filed: Feb. 8, 2024

(65) Prior Publication Data

US 2024/0268177 A1 Aug. 8, 2024

Related U.S. Application Data

(63) Continuation of application No. 18/104,674, filed on Feb. 1, 2023, now Pat. No. 11,903,290, which is a
(Continued)

(30) Foreign Application Priority Data

Jun. 6, 2018 (JP) .................................. 2018-108641

(51) Int. Cl.
*G06F 3/041* (2006.01)
*G09G 3/3208* (2016.01)
(Continued)

(52) U.S. Cl.
CPC ............. *H10K 59/38* (2023.02); *G06F 3/041* (2013.01); *G09G 3/3208* (2013.01); *G09G 2354/00* (2013.01); *H10K 59/12* (2023.02)

(58) Field of Classification Search
CPC .... H10K 59/38; H10K 59/12; H10K 59/8792; G06F 3/041; G06F 2203/04102;
(Continued)

(56) References Cited

U.S. PATENT DOCUMENTS

| 6,072,450 A | 6/2000 | Yamada et al. |
| 9,564,608 B2 | 2/2017 | Sato |

(Continued)

FOREIGN PATENT DOCUMENTS

| CN | 105280833 A | 1/2016 |
| CN | 106465507 A | 2/2017 |

(Continued)

OTHER PUBLICATIONS

International Search Report (Application No. PCT/IB2019/054423) Dated Jul. 16, 2019.
(Continued)

*Primary Examiner* — Temesghen Ghebretinsae
*Assistant Examiner* — Sosina Abebe
(74) *Attorney, Agent, or Firm* — Husch Blackwell LLP

(57) ABSTRACT

A novel display panel that is highly convenient or reliable is provided. The display panel includes a first pixel; the first pixel includes a first display element, a first color conversion layer, and a first absorption layer; the first display element emits first light; the first absorption layer overlaps with the first display element; and the first absorption layer absorbs the first light. Furthermore, the first color conversion layer is sandwiched between the first display element and the first absorption layer; the first color conversion layer converts the first light into second light; and the second light has a
(Continued)

spectrum including a high proportion of light with a long wavelength compared with the first light.

18 Claims, 14 Drawing Sheets

Related U.S. Application Data continuation of application No. 15/734,336, filed as application No. PCT/IB2019/054423 on May 29, 2019, now Pat. No. 11,574,961.

(51) Int. Cl.
*H10K 59/38* (2023.01)
*H10K 59/12* (2023.01)

(58) Field of Classification Search
CPC ......... G06F 2203/04112; G06F 3/0446; G09G 3/3208; G09G 2354/00; G02B 5/201; G02B 5/20; G09F 9/00; G09F 9/30; H05B 33/12
See application file for complete search history.

(56) References Cited

U.S. PATENT DOCUMENTS

| | | | |
|---|---|---|---|
| 10,181,295 B2 | 1/2019 | Hirakata | |
| 10,234,725 B2 | 3/2019 | Yang et al. | |
| 10,451,912 B2 | 10/2019 | Yamazaki et al. | |
| 10,622,575 B2 | 4/2020 | Tsukamoto et al. | |
| 10,777,762 B2 | 9/2020 | Seo et al. | |
| 10,790,462 B2 | 9/2020 | Seo et al. | |
| 11,545,642 B2 | 1/2023 | Seo et al. | |
| 2007/0085789 A1 | 4/2007 | De Vaan | |
| 2007/0145350 A1* | 6/2007 | Kobori | H10K 59/38 257/13 |
| 2012/0187394 A1 | 7/2012 | Hatano et al. | |
| 2012/0319569 A1* | 12/2012 | Okamoto | H10K 59/38 313/504 |
| 2013/0113843 A1* | 5/2013 | Yamazaki | H10K 59/351 313/505 |
| 2014/0151658 A1* | 6/2014 | Lee | H10K 50/11 257/40 |
| 2014/0354613 A1 | 12/2014 | Kim et al. | |
| 2015/0364523 A1 | 12/2015 | Sato | |
| 2017/0023830 A1 | 1/2017 | Yang et al. | |
| 2017/0025399 A1 | 1/2017 | Takeya et al. | |
| 2017/0335289 A1* | 11/2017 | Rezania | C12N 5/0676 |
| 2018/0095559 A1 | 4/2018 | Yamazaki et al. | |
| 2018/0224984 A1 | 8/2018 | Kim et al. | |
| 2019/0049779 A1 | 2/2019 | Lee et al. | |
| 2019/0131350 A1* | 5/2019 | Kwak | H10K 59/38 |
| 2019/0312220 A1 | 10/2019 | Tsukamoto et al. | |
| 2020/0403028 A1 | 12/2020 | Kusunoki et al. | |
| 2021/0013441 A1 | 1/2021 | Seo et al. | |
| 2023/0125419 A1 | 4/2023 | Seo et al. | |

FOREIGN PATENT DOCUMENTS

| | | |
|---|---|---|
| CN | 107250906 A | 10/2017 |
| CN | 107852794 A | 3/2018 |
| EP | 0845812 A | 6/1998 |
| EP | 3274765 A | 1/2018 |
| EP | 3328162 A | 5/2018 |
| JP | 10-162958 A | 6/1998 |
| JP | 2003-229260 A | 8/2003 |
| JP | 2015-162280 A | 9/2015 |
| JP | 2016-001564 A | 1/2016 |
| JP | 2016-006768 A | 1/2016 |
| JP | 2016-164855 A | 9/2016 |
| JP | 2018-060184 A | 4/2018 |
| JP | 2018-509647 | 4/2018 |
| JP | 2018-523848 | 8/2018 |
| KR | 2015-0143318 A | 12/2015 |
| KR | 2017-0062707 A | 6/2017 |
| KR | 2017-0118173 A | 10/2017 |
| KR | 2018-0022683 A | 3/2018 |
| TW | 201702705 | 1/2017 |
| TW | 201725495 | 7/2017 |
| TW | 201730645 | 9/2017 |
| TW | 201812406 | 4/2018 |
| WO | WO-2011/145418 | 11/2011 |
| WO | WO-2015/181678 | 12/2015 |
| WO | WO-2016/154214 | 9/2016 |
| WO | WO-2017/014564 | 1/2017 |
| WO | WO-2017/068454 | 4/2017 |
| WO | WO-2018/070348 | 4/2018 |

OTHER PUBLICATIONS

Written Opinion (Application No. PCT/IB2019/054423) Dated Jul. 16, 2019.
Chinese Office Action (Application No. 201980037661.2) Dated Jul. 5, 2022.
Taiwanese Office Action (Application No. 108119320) Dated Aug. 25, 2023.
Chinese Office Action (Application No. 201980037661.2) Dated Mar. 29, 2024.

* cited by examiner

DISPLAY PANEL, DISPLAY DEVICE, INPUT/OUTPUT DEVICE, AND DATA PROCESSING DEVICE

This application is a continuation of copending U.S. application Ser. No. 18/104,674, filed on Feb. 1, 2023 which is a continuation of U.S. application Ser. No. 15/734,336, filed on Dec. 2, 2020 (now U.S. Pat. No. 11,574,961 issued Feb. 7, 2023) which is a 371 of international application PCT/IB2019/054423 filed on May 29, 2019 which are all incorporated herein by reference.

TECHNICAL FIELD

One embodiment of the present invention relates to a display panel, a display device, an input/output device, or a data processing device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Thus, more specifically, examples of the technical field of one embodiment of the present invention disclosed in this specification include a semiconductor device, a display device, a light-emitting device, a power storage device, a memory device, a driving method thereof, and a manufacturing method thereof.

BACKGROUND ART

There is known a light-emitting device including a first light-emitting element, a second light-emitting element, and a third light-emitting element; the first light-emitting element, the second light-emitting element, and the third light-emitting element include a common EL layer; the EL layer includes a layer containing a light-emitting material emitting blue fluorescence and a layer containing a light-emitting material emitting yellow or green phosphorescence; light emitted from the second light-emitting element enters a color filter layer or a second color conversion layer; and light emitted from the third light-emitting element enters a first color conversion layer (Patent Document 1).

REFERENCE

Patent Document

[Patent Document 1] Japanese Published Patent Application No. 2016-6768

SUMMARY OF THE INVENTION

Problems to be Solved by the Invention

An object of one embodiment of the present invention is to provide a novel display panel that is highly convenient or reliable. Alternatively, an object is to provide a novel display device that is highly convenient or reliable. Alternatively, an object is to provide a novel input/output device that is highly convenient or reliable. Alternatively, an object is to provide a novel data processing device that is highly convenient or reliable. Alternatively, an object is to provide a novel display panel, a novel display device, a novel input/output device, a novel data processing device, or a novel semiconductor device.

Note that the descriptions of these objects do not disturb the existence of other objects. One embodiment of the present invention does not have to achieve all these objects. Objects other than these will be apparent from the descriptions of the specification, the drawings, the claims, and the like, and objects other than these can be derived from the descriptions of the specification, the drawings, the claims, and the like.

Means for Solving the Problems (1) One embodiment of the present invention is a display panel including a display region. The display region includes a first pixel, and the first pixel includes a first display element, a first color conversion layer, and a first absorption layer.

The first display element emits first light.

The first absorption layer overlaps with the first display element, and the first absorption layer absorbs the first light.

The first color conversion layer is sandwiched between the first absorption layer and the first display element, and the first color conversion layer converts the first light into second light. Note that the second light has a spectrum including a high proportion of light with a long wavelength compared with the first light.

Accordingly, the first light emitted from the first display element can be converted into the second light. Alternatively, the first light included in external light can be weakened before reaching the first color conversion layer. Alternatively, a phenomenon in which the first light included in external light is converted into the second light can be inhibited. Alternatively, a phenomenon in which black display is impaired by external light can be inhibited. Alternatively, display can be performed with high contrast. As a result, a novel display panel that is highly convenient or reliable can be provided.

(2) One embodiment of the present invention is the above display panel in which the first absorption layer absorbs the first light and third light. Note that the third light has a spectrum including a high proportion of light with a long wavelength compared with the second light.

Thus, the third light can be absorbed. Alternatively, a phenomenon in which black display is impaired by external light can be inhibited. Alternatively, display can be performed with high contrast. As a result, a novel display panel that is highly convenient or reliable can be provided.

(3) One embodiment of the present invention is the above display panel in which the first color conversion layer converts the first light into the second light and the third light.

Accordingly, the first light emitted from the first display element can be converted into the second light and the third light. Alternatively, the converted third light can be absorbed. Alternatively, a phenomenon in which the first light included in external light is converted into the second light and the third light can be inhibited. Alternatively, a phenomenon in which vivid display using the second light is impaired by the third light can be inhibited. As a result, a novel display panel that is highly convenient or reliable can be provided.

(4) One embodiment of the present invention is the above display panel in which the display region includes a second pixel. The second pixel includes a second display element, a second color conversion layer, and a second absorption layer.

The second display element emits the first light.

The second absorption layer overlaps with the second display element, and the second absorption layer absorbs the first light.

The second color conversion layer is sandwiched between the second absorption layer and the second display element, and the second color conversion layer converts the first light into the third light.

Thus, the first light emitted from the second display element can be converted into the third light. Alternatively, the first light included in external light can be weakened before reaching the second color conversion layer. Alternatively, a phenomenon in which the first light included in external light is converted into the third light can be inhibited. Alternatively, a phenomenon in which black display is impaired by external light can be inhibited. Alternatively, display can be performed with high contrast. Alternatively, the second display element can be formed through the same process as that for forming the first display element. As a result, a novel display panel that is highly convenient or reliable can be provided.

(5) One embodiment of the present invention is the above display panel in which the second absorption layer absorbs the first light and the second light.

Accordingly, the second light can be absorbed. Alternatively, a phenomenon in which black display is impaired by external light can be inhibited. Alternatively, display can be performed with high contrast. As a result, a novel display panel that is highly convenient or reliable can be provided.

(6) One embodiment of the present invention is the above display panel in which the second color conversion layer converts the first light into the second light and the third light.

Thus, the first light emitted from the second display element can be converted into the second light and the third light. Alternatively, the converted second light can be absorbed. Alternatively, a phenomenon in which the first light included in external light is converted into the second light and the third light can be inhibited. Alternatively, a phenomenon in which vivid display using the third light is impaired by the second light can be inhibited. As a result, a novel display panel that is highly convenient or reliable can be provided.

(7) One embodiment of the present invention is the above display panel in which the display region includes a third pixel. The third pixel includes a third display element, and the third display element emits the first light.

Thus, display can be performed using the first light, the second light, and the third light. Alternatively, full color display can be performed using only the display elements emitting the first light. Alternatively, the second display element and the third display element can be formed through the same process as that for forming the first display element. As a result, a novel display panel that is highly convenient or reliable can be provided.

(8) One embodiment of the present invention is the above display panel in which the third pixel includes a third color conversion layer and a third absorption layer.

The third absorption layer overlaps with the third display element, and the third absorption layer absorbs the second light and the third light.

The first color conversion layer converts the first light into the second light, the third light, and fourth light, and the second color conversion layer converts the first light into the second light, the third light, and the fourth light.

The third color conversion layer is sandwiched between the third absorption layer and the third display element, and the third color conversion layer converts the first light into the second light, the third light, and the fourth light.

The fourth light has a spectrum including a high proportion of light with a short wavelength compared with the second light.

Accordingly, the first light emitted from the third display element can be converted into the second light, the third light, and the fourth light. Alternatively, the converted second light and third light can be absorbed. Alternatively, a phenomenon in which vivid display using the fourth light is impaired by the second light and the third light can be inhibited. Alternatively, the same structure as that of the first color conversion layer can be used for the second color conversion layer and the third color conversion layer. As a result, a novel display panel that is highly convenient or reliable can be provided.

(9) One embodiment of the prevent invention is the above display panel in which the first pixel emits light of a color that has a chromaticity x of greater than or equal to 0.130 and less than or equal to 0.250 and a chromaticity y of greater than 0.710 and less than or equal to 0.810 in the CIE 1931 chromaticity coordinates, the second pixel emits light of a color that has a chromaticity x of greater than 0.680 and less than or equal to 0.720 and a chromaticity y of greater than or equal to 0.260 and less than or equal to 0.320 in the CIE 1931 chromaticity coordinates, and the third pixel emits light of a color that has a chromaticity x of greater than or equal to 0.120 and less than or equal to 0.170 and a chromaticity y of greater than or equal to 0.020 and less than 0.060 in the CIE 1931 chromaticity coordinates.

Thus, a vivid image can be displayed. As a result, a novel display panel that is highly convenient or reliable can be provided.

(10) One embodiment of the present invention is the above display panel in which the display region includes a group of pixels, a different group of pixels, a scan line, and a signal line.

The group of pixels is arranged in a row direction, and the group of pixels includes the first pixel.

The different group of pixels is arranged in a column direction intersecting the row direction, and the different group of pixels includes the first pixel.

The scan line is electrically connected to the group of pixels, and the signal line is electrically connected to the different group of pixels.

Thus, image data can be supplied to a plurality of pixels. As a result, a novel display panel that is highly convenient or reliable can be provided.

(11) One embodiment of the present invention is the display panel in which the display region includes a plurality of pixels in a matrix. The display region includes 7600 or more pixels in the row direction, and the display region includes 4300 or more pixels in the column direction.

(12) One embodiment of the present invention is the above display panel in which a diagonal of the display region is greater than or equal to 40 inches.

Thus, a high-resolution image can be displayed. Alternatively, a realistic image can be displayed. As a result, a novel display panel that is highly convenient or reliable can be provided.

(13) One embodiment of the present invention is a display device including the above display panel and a control portion.

The control portion is supplied with image data and control data. The control portion generates data on the basis of the image data, and the control portion generates a control signal on the basis of the control data. The control portion supplies the data and the control signal.

The display panel is supplied with the data and the control signal, and the pixel performs display on the basis of the data.

Thus, the image data can be displayed using the display element. As a result, a novel display device that is highly convenient or reliable can be provided.

(14) One embodiment of the present invention is an input/output device including an input portion and a display portion.

The display portion includes the above display panel.

The input portion includes a sensing region, and the input portion senses an object approaching the sensing region. Furthermore, the sensing region includes a region overlapping with the pixel.

Thus, the object approaching the region overlapping with the display portion can be sensed while image data is displayed using the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

(15) One embodiment of the present invention is a data processing device including an arithmetic device and an input/output device.

The arithmetic device is supplied with input data or sensing data. The arithmetic device generates control data and image data on the basis of the input data or the sensing data, and the arithmetic device supplies the control data and the image data.

The input/output device supplies the input data and the sensing data, and the input/output device is supplied with the control data and the image data. The input/output device includes a display portion, an input portion, and a sensing portion.

The display portion includes the above display panel, and the display portion displays the image data on the basis of the control data.

The input portion generates the input data, and the sensing portion generates the sensing data.

Thus, the control data can be generated on the basis of the input data or the sensing data. Alternatively, the image data can be displayed on the basis of the input data or the sensing data. As a result, a novel data processing device that is highly convenient or reliable can be provided.

(16) One embodiment of the present invention is a data processing device including one or more of a keyboard, a hardware button, a pointing device, a touch sensor, an illuminance sensor, an imaging device, an audio input device, an eye-gaze input device, and an attitude detection device, and the above display panel.

Thus, an arithmetic device can generate image data or control data on the basis of data supplied using a variety of input devices. As a result, a novel data processing device that is highly convenient or reliable can be provided.

In this specification, in the case where a substance A is dispersed in a matrix formed with a substance B, the substance B forming the matrix is referred to as a host material, and the substance A dispersed in the matrix is referred to as a guest material. Note that the substance A and the substance B may each be a single substance or a mixture of two or more kinds of substances.

Although the block diagram in which components are classified by their functions and shown as independent blocks is shown in the drawings attached to this specification, it is difficult to completely separate actual components according to their functions and one component can relate to a plurality of functions.

In this specification, the names of a source and a drain of a transistor interchange with each other depending on the polarity of the transistor and the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, for the sake of convenience, the connection relation of a transistor is sometimes described assuming that the source and the drain are fixed; in reality, the names of the source and the drain interchange with each other according to the above relation of the potentials.

In this specification, a source of a transistor means a source region that is part of a semiconductor film functioning as an active layer or a source electrode connected to the above semiconductor film. Similarly, a drain of a transistor means a drain region that is part of the above semiconductor film or a drain electrode connected to the above semiconductor film. Moreover, a gate means a gate electrode.

In this specification, a state in which transistors are connected in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, connection means electrical connection and corresponds to a state in which a current, a voltage, or a potential can be supplied or transmitted. Accordingly, a state of being connected does not necessarily mean a state of being directly connected and also includes, in its category, a state of being indirectly connected through a circuit element such as a wiring, a resistor, a diode, or a transistor that allows a current, a voltage, or a potential to be supplied or transmitted.

In this specification, even when independent components are connected to each other in a circuit diagram, there is actually a case where one conductive film has functions of a plurality of components, such as a case where part of a wiring functions as an electrode, for example. Connection in this specification also includes such a case where one conductive film has functions of a plurality of components, in its category.

Furthermore, in this specification, one of a first electrode and a second electrode of a transistor refers to a source electrode and the other refers to a drain electrode.

Effect of the Invention

According to one embodiment of the present invention, a novel display panel that is highly convenient or reliable can be provided. Alternatively, a novel display device that is highly convenient or reliable can be provided. Alternatively, a novel input/output device that is highly convenient or reliable can be provided. Alternatively, a novel data processing device that is highly convenient or reliable can be provided. Alternatively, a novel display panel, a novel display device, a novel input/output device, a novel data processing device, or a novel semiconductor device can be provided.

Note that the descriptions of these effects do not disturb the existence of other effects. One embodiment of the present invention does not need to have all these effects. Effects other than these will be apparent from the descriptions of the specification, the drawings, the claims, and the like, and effects other than these can be derived from the descriptions of the specification, the drawings, the claims, and the like.

MODE FOR CARRYING OUT THE INVENTION

Figure 1A:
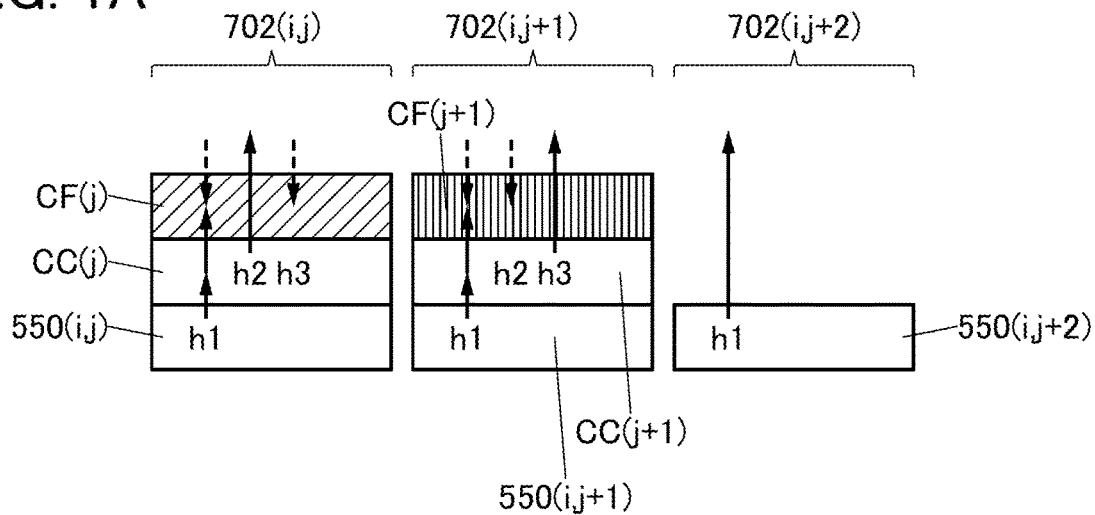
FIG. 1(A) to (C) Diagrams illustrating structures of pixels of a display panel of an embodiment and emission spectra and an absorption spectrum of an absorption layer.

One embodiment of the present invention is a display panel including a display region. The display region includes a first pixel, and the first pixel includes a first display element, a first color conversion layer, and a first absorption layer. The first display element emits first light, the first absorption layer overlaps with the first display element, and the first absorption layer absorbs the first light. The first color conversion layer is sandwiched between the first absorption layer and the first display element, the first color conversion layer converts the first light into second light, and the second light has a spectrum including a high proportion of light with a long wavelength compared with the first light.

Accordingly, the first light emitted from the first display element can be converted into the second light. Alternatively, the first light included in external light can be weakened before reaching the first color conversion layer. Alternatively, a phenomenon in which the first light included in external light is converted into the second light can be inhibited. Alternatively, a phenomenon in which black display is impaired by external light can be inhibited. Alternatively, display can be performed with high contrast. As a result, a novel display panel that is highly convenient or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Thus, the present invention should not be construed as being limited to the descriptions in the following embodiments. Note that in structures of the invention described below, the same portions or portions having similar functions are denoted by the same reference numerals in different drawings, and repeated description thereof is omitted.

Embodiment 1

In this embodiment, structures of a display panel of one embodiment of the present invention will be described with reference to FIG. 1 to FIG. 5.

Figure 1B:
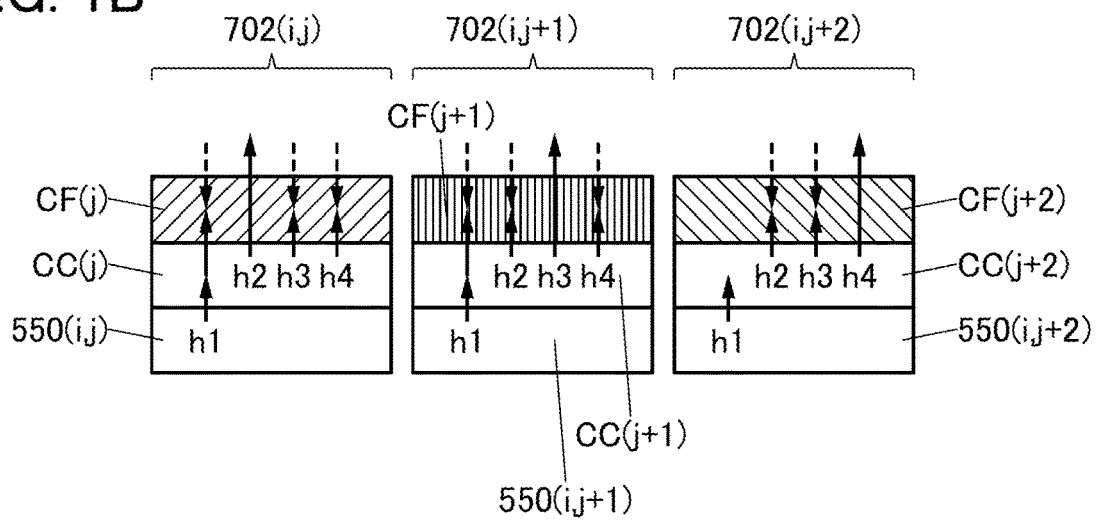
Figure 1C:
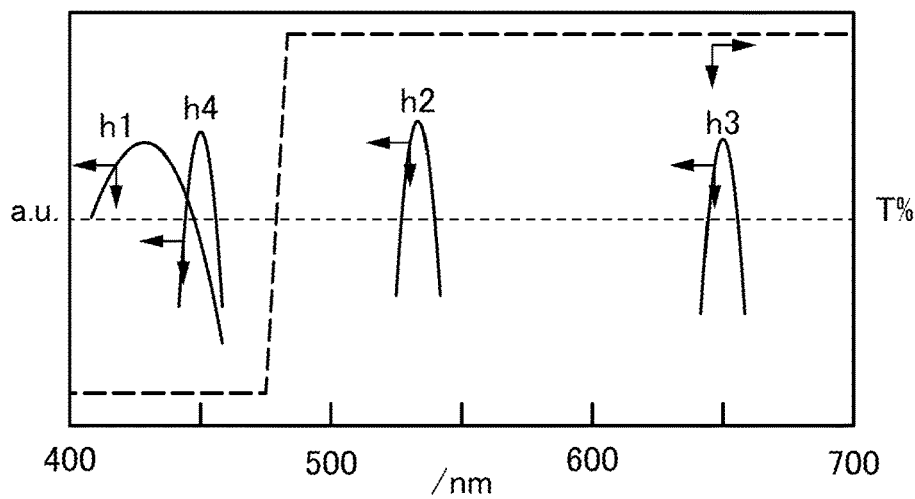

FIG. 1 shows structures of the display panel of one embodiment of the present invention. FIG. 1(A) is a schematic view illustrating a structure of pixels of the display panel of one embodiment of the present invention, and FIG. 1(B) is a schematic view illustrating a structure different from that in FIG. 1(A). FIG. 1(C) shows emission spectra of the display panel of one embodiment of the present invention and an absorption spectrum of an absorption layer. Note that a solid line represents the emission spectrum, and a dashed line represents the absorption spectrum.

FIG. 2 shows emission spectra of the display panel of one embodiment of the present invention and absorption spectra of an absorption layer. Note that a solid line represents the emission spectrum, and a dashed line represents the absorption spectrum.

Figure 3A:
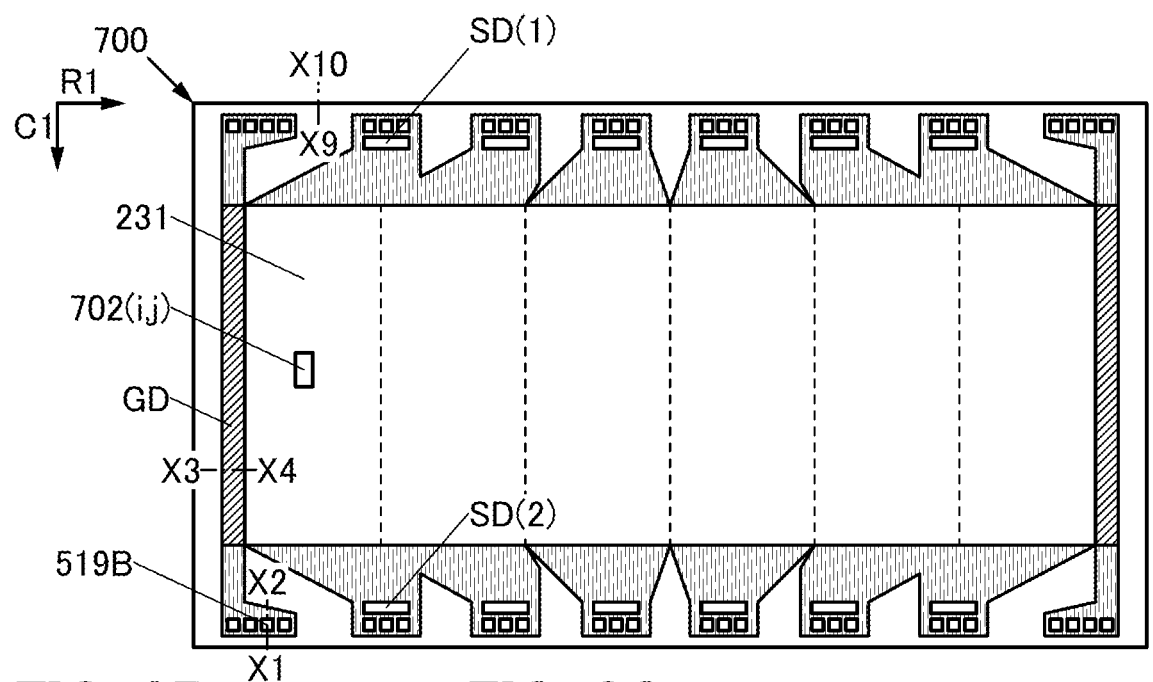
FIG. 3(A) to (C) Top views illustrating a structure of a display panel of an embodiment.
Figure 3B:
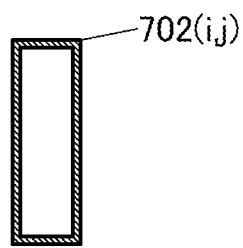

FIG. 3 shows a structure of the display panel of one embodiment of the present invention. FIG. 3(A) is a top view of the display panel of one embodiment of the present invention, and FIG. 3(B) shows part of FIG. 3(A).

Figure 4A:
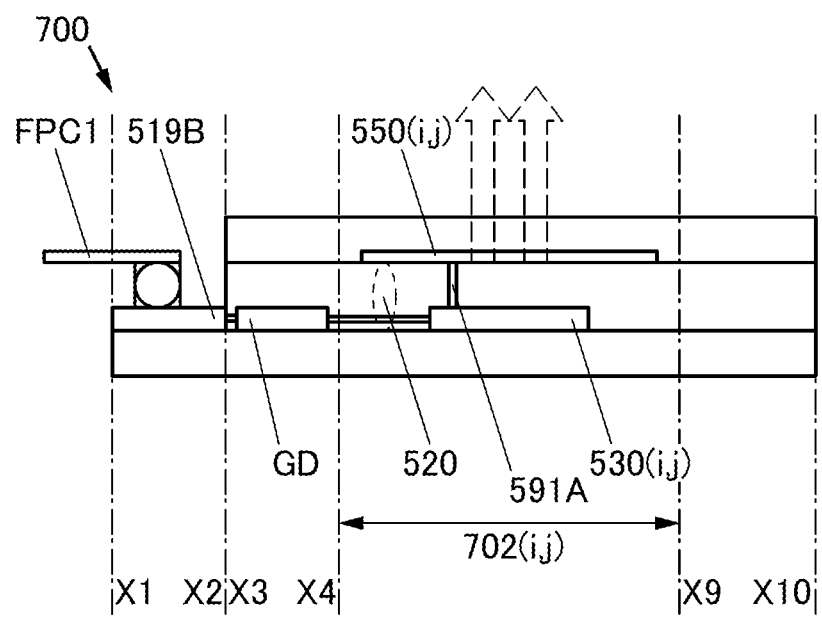
FIGS. 4(A) and (B) A cross-sectional view and a circuit diagram illustrating a structure of a display panel of an embodiment.
Figure 4B:
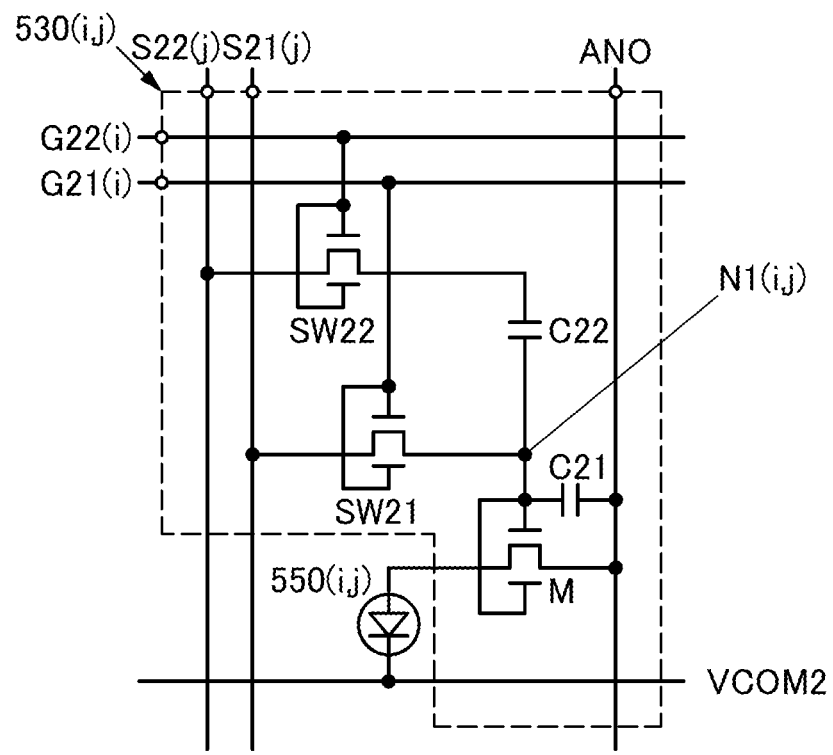

FIG. 4 shows a structure of the display panel of one embodiment of the present invention. FIG. 4(A) is a cross-sectional view along a cutting line X1-X2, a cutting line X3-X4, and a cutting line X9-X10 and of a pixel in FIG. 3(A), and FIG. 4(B) is a circuit diagram illustrating a structure of a pixel circuit $530(i,j)$.

Figure 5A:
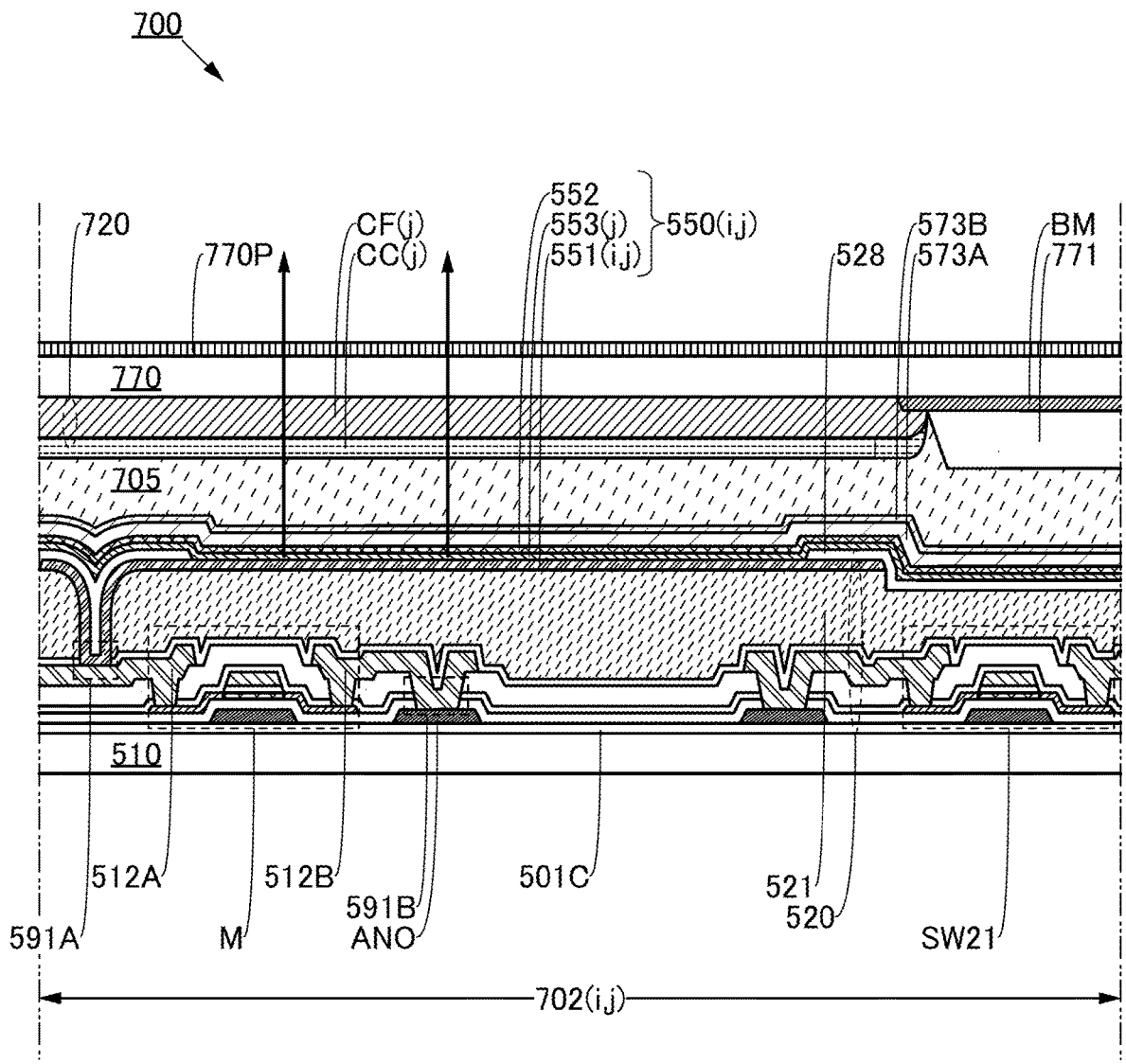
FIGS. 5(A) and (B) Cross-sectional views illustrating a structure of a display panel of an embodiment.
Figure 5B:
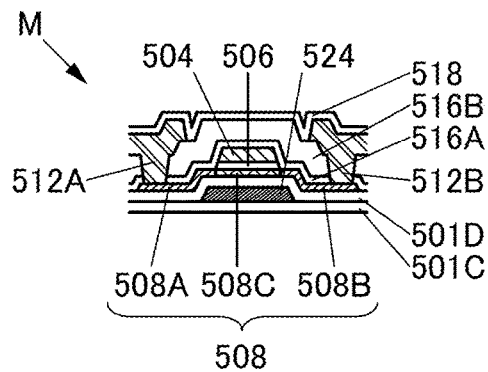

FIG. 5 shows a structure of the display panel of one embodiment of the present invention. FIG. 5(A) is a cross-sectional view of a pixel $702(i,j)$ in FIG. 3(A), and FIG. 5(B) is a cross-sectional view illustrating part of FIG. 5(A).

Note that in this specification, an integer variable of 1 or more is sometimes used in reference numerals. For example, (p) where p is an integer variable of 1 or more is sometimes used in part of a reference numeral that specifies any of p components at a maximum. For another example, (m,n) where m and n are each an integer variable of 1 or more is sometimes used in part of a reference numeral that specifies any of m×n components at a maximum.

<Structure Example 1 of Display Panel 700>

A display panel 700 described in this embodiment includes a display region 231 and a functional layer 520 (see FIG. 3(A) and FIG. 4(A)). The display region 231 includes the pixel 702$(i,j)$ (see FIG. 3(B)).

<<Structure Example 1 of Pixel 702(i,j)>>

The pixel 702(i,j) includes a display element 550(i,j), a color conversion layer CC(j), and an absorption layer CF(j) (see FIG. 1(A) and FIG. 1(B)).

<<Structure Example 1 of Display Element 550(i,j)>>

The display element 550(i,j) emits light h1. For example, blue light or ultraviolet light can be used as the light h1. A light-emitting element emitting the light h1 can be used as the display element 550(i,j). Specifically, an organic EL element or the like can be used as the display element 550(i,j).

For example, a tandem light-emitting element including a plurality of light-emitting units and an intermediate layer can be used as the display element 550(i,j). Specifically, a structure including two or more light-emitting units containing a material emitting blue light can be used for the display element 550(i,j). When light-emitting units containing a material emitting the same color are overlapped with each other with the intermediate layer therebetween, the amount of emitted light can be increased without increasing the current density. This leads to higher reliability of the display panel.

<<Structure Example 1 of Absorption Layer CF(j)>>

Figure 2A:
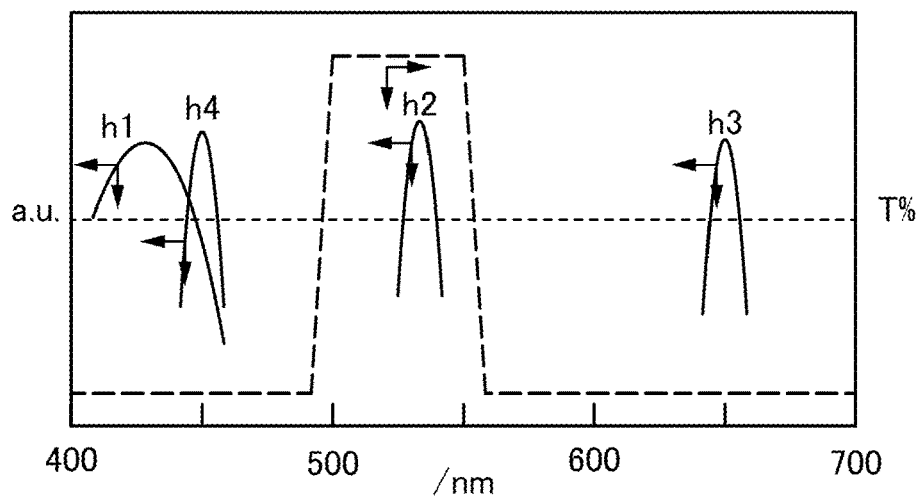
FIG. 2(A) to (C) Diagrams each illustrating emission spectra of a display panel of an embodiment and an absorption spectrum of an absorption layer.

The absorption layer CF(j) overlaps with the display element 550(i,j), and the absorption layer CF(j) absorbs the light h1 (see FIG. 1(A), FIG. 1(C), or FIG. 2(A)).

For example, a material absorbing the light h1 can be used for the absorption layer CF(j). Alternatively, a material absorbing the blue light h1 or ultraviolet light can be used for the absorption layer CF(j). For example, a sharp cut filter transmitting yellow light can be used as the absorption layer CF(j) (see FIG. 1(C)). Alternatively, a band pass filter transmitting green light can be used as the absorption layer CF(j) (see FIG. 2(A)). Accordingly, the absorption layer CF(j) can absorb the light h1 emitted from the display element 550(i,j). Alternatively, the light h1 included in external light can be absorbed. Alternatively, before the light h1 included in external light reaches the color conversion layer CC(j), its intensity can be weakened.

<<Structure Example 1 of Color Conversion Layer CC(j)>>

The conversion layer CC(j) is sandwiched between the absorption layer CF(j) and the display element 550(i,j). The conversion layer CC(j) converts the light h1 into light h2.

For example, a florescent substance can be used for the color conversion layer CC(j). Specifically, a quantum dot can be used for the color conversion layer CC(j).

The light h2 has a spectrum including a high proportion of light with a long wavelength compared with the light h1 (see FIG. 1(C)). For example, blue light can be used as the light h1, and green light can be used as the light h2. Specifically, a quantum dot converting the blue light h1 into the green light h2 can be used for the color conversion layer CC(j). Accordingly, the light h1 can be efficiently converted into the light h2. Alternatively, the light h1 can be converted into the light h2 with a narrow half width of the spectrum. Alternatively, a bright color can be displayed.

Thus, the light h1 emitted from the display element 550(i,j) can be converted into the light h2. Alternatively, the light h1 included in external light can be weakened before reaching the color conversion layer CC(j). Alternatively, a phenomenon in which the light h1 included in external light is converted into the light h2 can be inhibited. Alternatively, a phenomenon in which black display is impaired by external light can be inhibited. Alternatively, display can be performed with high contrast. As a result, a novel display panel that is highly convenient or reliable can be provided.

<<Structure Example 2 of Absorption Layer CF(j)>>

For example, the absorption layer CF(j) absorbs the light h1 and light h3. Note that the light h3 has a spectrum including a high proportion of light with a long wavelength compared with the light h2 (see FIG. 1(A) and FIG. 2(A)).

Specifically, the green light h2 can be used, and a color filter transmitting the green light h2 can be used as the absorption layer CF(j). For example, a band pass filter transmitting green light can be used as the absorption layer CF(j) (see FIG. 2(A)). Thus, the absorption layer CF(j) can absorb, for example, the blue light h1 and the red light h3.

Accordingly, the light h1 and the light h3 included in external light can be absorbed. Alternatively, a phenomenon in which black display is impaired by external light can be inhibited. Alternatively, display can be performed with high contrast. As a result, a novel display panel that is highly convenient or reliable can be provided.

<<Structure Example 2 of Color Conversion Layer CC(j)>>

For example, the color conversion layer CC(j) converts the light h1 into the light h2 and the light h3 (see FIG. 1(B) and FIG. 2(A)).

Specifically, the blue light h1 can be converted into the green light h2 and the red light h3 using a florescent substance. For example, a quantum dot converting the blue light h1 into the green light h2 and a quantum dot converting the blue light h1 into the red light h3 can be mixed and used for the color conversion layer CC(j).

Thus, the light h1 emitted from the display element 550(i,j) can be converted into the light h2 and the light h3. Alternatively, the converted light h3 can be absorbed. Alternatively, a phenomenon in which the light h1 included in external light is converted into the light h2 and the light h3 can be inhibited. Alternatively, a phenomenon in which vivid display using the light h2 is impaired by the light h3 can be inhibited. As a result, a novel display panel that is highly convenient or reliable can be provided.

<Structure Example 2 of Display Panel 700>

In the display panel described in this embodiment, the display region 231 includes a pixel 702(i,j+1) (see FIG. 3(B)).

<<Structure Example of Pixel 702(i,j+1)>>

The pixel 702(i,j+1) includes a display element 550(i,j+1), a color conversion layer CC(j+1), and an absorption layer CF(j+1) (see FIG. 1(A) and FIG. 1 (B)).

<<Structure Example of Display Element 550(i,j+1)>>

The display element 550(i,j+1) emits the light h1. For example, blue light or ultraviolet light can be used as the light h1, and a light-emitting element emitting the light h1 can be used as the display element 550(i,j+1). Specifically, an organic EL element or the like can be used as the display element 550(i,j+1). For example, the same structure as a structure used for the display element 550(i,j) can be used for the display element 550(i,j+1).

<<Structure Example 1 of Absorption Layer CF(j+1)>>

Figure 2B:
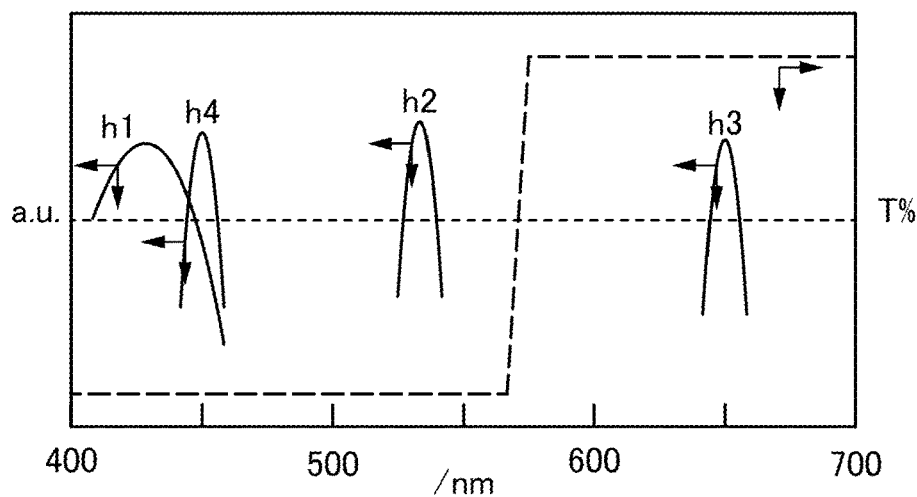

The absorption layer CF(j+1) overlaps with the display element 550(i,j+1), and the absorption layer CF(j+1) absorbs the light h1 (see FIG. 1(A), FIG. 1(C), or FIG. 2(B)).

For example, a material absorbing the light h1 can be used for the absorption layer CF(j+1). A material absorbing blue light or ultraviolet light can be used for the absorption layer CF(j+1). For example, a sharp cut filter transmitting yellow light can be used as the absorption layer CF(j) (see FIG. 1(C)). Alternatively, a sharp cut filter transmitting red light can be used as the absorption layer CF(j+1) (see FIG. 2(B)). Accordingly, the absorption layer CF(j+1) can absorb the light h1 emitted from the display element 550(i,j+1). Alternatively, the light h1 included in external light can be absorbed. Alternatively, before the light h1 included in external light reaches the color conversion layer CC(j+1), its intensity can be weakened.

<<Structure Example 1 of Color Conversion Layer CC(j+1)>>

The color conversion layer CC(j+1) is sandwiched between the absorption layer CF(j+1) and the display element 550($i,j$+1), and the color conversion layer CC(j+1) converts the light h1 into the light h3.

For example, a florescent substance can be used for the color conversion layer CC(j+1). Specifically, a quantum dot can be used for the color conversion layer CC(j+1). For example, a quantum dot converting the blue light h1 into the red light h3 can be used for the color conversion layer CC(j+1).

Thus, the light h1 emitted from the display element 550($i,j$+1) can be converted into the light h3. Alternatively, the light h1 included in external light can be weakened before reaching the color conversion layer CC(j+1). Alternatively, a phenomenon in which the light h1 included in external light is converted into the light h3 can be inhibited. Alternatively, a phenomenon in which black display is impaired by external light can be inhibited. Alternatively, display can be performed with high contrast. Alternatively, the display element 550($i,j$+1) can be formed through the same process as that for forming the display element 550($i,j$). As a result, a novel display panel that is highly convenient or reliable can be provided.

<<Structure Example 2 of Absorption Layer CF(j+1)>>

For example, the absorption layer CF(j+1) absorbs the light h1 and the light h2 (see FIG. 1(A) and FIG. 2(B)).

Specifically, the red light h3 can be used, and a color filter transmitting the red light h3 can be used as the absorption layer CF(j+1). For example, a band pass filter transmitting red light can be used as the absorption layer CF(j+1) (see FIG. 2(B)). Thus, the absorption layer CF(j+1) can absorb, for example, the blue light h1 and the green light h2.

Accordingly, the light h1 and the light h2 can be absorbed. Alternatively, a phenomenon in which black display is impaired by external light can be inhibited. Alternatively, display can be performed with high contrast. As a result, a novel display panel that is highly convenient or reliable can be provided.

<<Structure Example 2 of Color Conversion Layer CC(j+1)>>

For example, the color conversion layer CC(j+1) converts the light h1 into the light h2 and the light h3 (see FIG. 1(B) and FIG. 2(B)).

Specifically, the blue light h1 can be converted into the green light h2 and the red light h3 using a florescent substance. For example, a quantum dot converting the blue light h1 into the green light h2 and a quantum dot converting the blue light h1 into the red light h3 can be mixed and used for the color conversion layer CC(j+1).

Thus, the light h1 emitted from the display element 550($i,j$+1) can be converted into the light h2 and the light h3. Alternatively, the converted light h2 can be absorbed. Alternatively, a phenomenon in which the light h1 included in external light is converted into the light h2 and the light h3 can be inhibited. Alternatively, a phenomenon in which vivid display using the light h3 is impaired by the light h2 can be inhibited. As a result, a novel display panel that is highly convenient or reliable can be provided.

<Structure Example 3 of Display Panel 700>

Figure 3C:
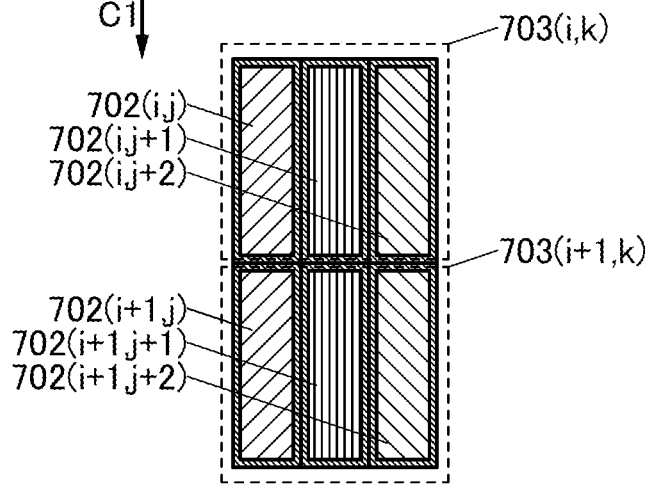

In the display panel described in this embodiment, the display region 231 includes a pixel 702($i,j$+2) (see FIG. 3(C)).

<<Structure Example 1 of Pixel 702($i,j$+2)>>

The pixel 702($i,j$+2) includes a display element 550($i,j$+2) (see FIG. 1(A) and FIG. 1(B)).

<<Structure Example of Display Element 550($i,j$+2)>>

The display element 550($i,j$+2) emits the light h1. For example, blue light or ultraviolet light can be used as the light h1, and a light-emitting element emitting the light h1 can be used as the display element 550($i,j$+2). Specifically, an organic EL element or the like can be used as the display element 550($i,j$+2). For example, the same structure as a structure used for the display element 550($i,j$) can be used for the display element 550($i,j$+2).

Thus, display can be performed using the light h1, the light h2, and the light h3. Alternatively, full color display can be performed using only display elements emitting the light h1. Alternatively, the display element 550($i,j$+1) and the display element 550($i,j$+2) can be formed through the same process as that for forming the display element 550($i,j$). As a result, a novel display panel that is highly convenient or reliable can be provided.

<Structure Example 4 of Display Panel 700>

In the display panel described in this embodiment, the display region 231 includes the pixel 702($i,j$), the pixel 702($i,j$+1), and the pixel 702($i,j$+2) (see FIG. 3(C)).

<<Structure Example 2 of Pixel 702($i,j$+2)>>

The pixel 702($i,j$+2) includes a color conversion layer CC(j+2) and an absorption layer CF(j+2) (see FIG. 1(B)).

<<Structure Example of Absorption Layer CF(j+2)>>

Figure 2C:
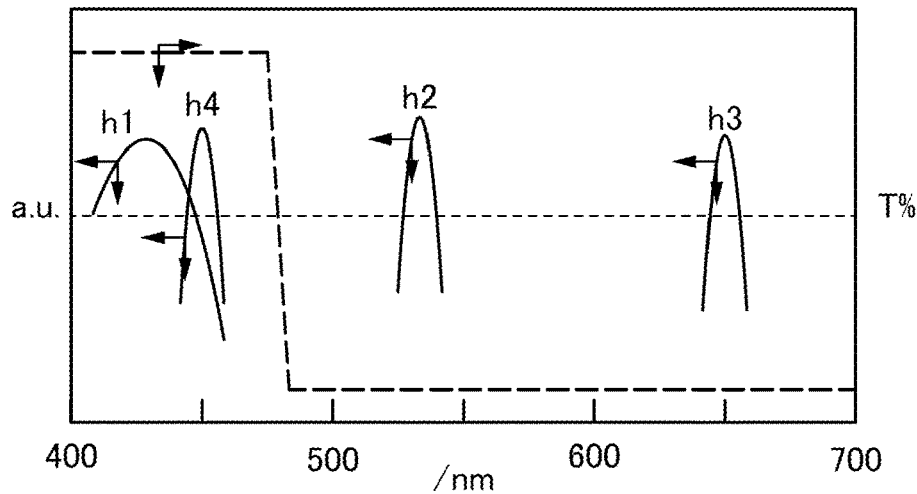

The absorption layer CF(j+2) overlaps with the display element 550($i,j$+2), and the absorption layer CF(j+2) absorbs the light h2 and the light h3 (see FIG. 2(C)).

Specifically, a color filter transmitting blue light can be used as the absorption layer CF(j+2). For example, a band pass filter transmitting blue light can be used as the absorption layer CF(j+2) (see FIG. 2(C)). Thus, the absorption layer CF(j+2) can absorb, for example, the green light h2 and the red light h3.

<<Structure Example 3 of Color Conversion Layer CC(j)>>

The conversion layer CC(j) converts the light h1 into the light h2, the light h3, and light h4 (see FIG. 1(B)). In other words, the light h1 is converted into white light.

For example, a florescent substance can be used for the color conversion layer CC(j). Specifically, a quantum dot converting the light h1 into the light h2, a quantum dot converting the light h1 into the light h3, and a quantum dot converting the light h1 into the light h4 can be used for the color conversion layer CC(j). Note that the color conversion layer CC(j) may transmit part of the light h1.

<<Structure Example 3 of Color Conversion Layer CC(j+1)>>

The color conversion layer CC(j+1) converts the light h1 into the light h2, the light h3, and the light h4. For example, the same structure as that of the color conversion layer CC(j) can be used for the color conversion layer CC(j+1).

<<Structure Example of Color Conversion Layer CC(j+2)>>

The color conversion layer CC(j+2) is sandwiched between the absorption layer CF(j+2) and the display element 550($i,j$+2).

The conversion layer CC(j+2) converts the light h1 into the light h2, the light h3, and the light h4. For example, the same structure as that of the color conversion layer CC(j) can be used for the color conversion layer CC(j+1).

The light h4 has a spectrum including a high proportion of light with a short wavelength compared with the light h2 (see FIG. 1(C)). For example, blue light can be used as the light h1, green light can be used as the light h2, and blue light can be used as the light h4.

Thus, the light h1 emitted from the display element 550($i,j$+2) can be converted into the light h2, the light h3, and the light h4. Alternatively, the converted light h2 and light h3 can be absorbed. Alternatively, a phenomenon in which vivid display using the light h4 is impaired by the light h2 and the light h3 can be inhibited. Alternatively, the same structure as that of the color conversion layer CC(j) can be used for the color conversion layer CC(j+1) and the color conversion layer CC(j+2). As a result, a novel display panel that is highly convenient or reliable can be provided.

<Structure Example 5 of Display Panel 700>

In the display panel described in this embodiment, the pixel 702($i,j$) emits light of a color that has a chromaticity x of greater than or equal to 0.130 and less than or equal to 0.250 and a chromaticity y of greater than 0.710 and less than or equal to 0.810 in the CIE 1931 chromaticity coordinates.

Moreover, the pixel 702($i,j$+1) emits light of a color that has a chromaticity x of greater than 0.680 and less than or equal to 0.720 and a chromaticity y of greater than or equal to 0.260 and less than or equal to 0.320 in the CIE 1931 chromaticity coordinates.

Furthermore, the pixel 702($i,j$+2) emits light of a color that has a chromaticity x of greater than or equal to 0.120 and less than or equal to 0.170 and a chromaticity y of greater than or equal to 0.020 and less than 0.060 in the CIE 1931 chromaticity coordinates The pixel 702($i,j$), the pixel 702($i,j$+1), and the pixel 702($i,j$+2) are provided so that the area ratio of their color gamut to the BT.2020 color gamut in the CIE chromaticity diagram (x,y) is higher than or equal to 80%, or alternatively, the color gamut coverage is higher than or equal to 75%. Preferably, they are provided so that the area ratio is higher than or equal to 90%, or alternatively, the coverage is higher than or equal to 85%.

Thus, a vivid image can be displayed. Accordingly, display with an extremely wide color gamut satisfying a color gamut of Recommendation ITU-R BT.2020-2 standard, which is an international standard, can be performed. As a result, a novel display panel that is highly convenient or reliable can be provided.

<<Structure Example 2 of Pixel 702($i,j$)>>

The pixel 702($i,j$) includes the display element 550($i,j$) and the pixel circuit 530($i,j$).

The display element 550($i,j$) is electrically connected to the pixel circuit 530($i,j$).

<<Structure Example of Functional Layer 520>>

The functional layer 520 includes the pixel circuit 530($i,j$). Moreover, the functional layer 520 has an opening portion 591A. For example, in the opening portion 591A, the pixel circuit 530($i,j$) is electrically connected to the display element 550($i,j$) (see FIG. 4(A)).

<<Structure Example 1 of Pixel Circuit 530($i,j$)>>

The pixel circuit 530($i,j$) is electrically connected to a scan line G21($i$) and a signal line S21($j$) (see FIG. 4(B)).

A switch, a transistor, a diode, a resistor, an inductor, a capacitor, or the like can be used in the pixel circuit 530($i,j$), for example. Specifically, a transistor can be used as a switch.

<<Structure Example 2 of Pixel Circuit 530($i,j$)>>

For example, a switch SW21, a transistor M, and a capacitor C21 can be used in the pixel circuit 530($i,j$).

The pixel circuit 530($i,j$) includes the transistor M, the capacitor C21, the switch SW21, and a node N1($i,j$).

The transistor M includes a first electrode electrically connected to a conductive film ANO and a second electrode electrically connected to the display element 550($i,j$).

The capacitor C21 includes a first electrode electrically connected to a gate electrode of the transistor M and a second electrode electrically connected to the conductive film ANO.

The switch SW21 includes a first terminal to which a first signal is supplied and includes a second terminal electrically connected to the gate electrode of the transistor M. Note that the switch SW21 has a function of switching a conducting state or a non-conducting state on the basis of the first signal.

The display element 550($i,j$) performs display on the basis of a potential VN of the node N1($i,j$).

<<Structure Example 2 of Pixel Circuit 530($i,j$)>>

The pixel circuit 530($i,j$) includes the transistor M, the capacitor C21, the switch SW21, the node N1($i,j$), a capacitor C22, and a switch SW22.

The transistor M includes the first electrode electrically connected to the conductive film ANO and the second electrode electrically connected to the display element 550($i,j$).

The capacitor C21 includes the first electrode electrically connected to the gate electrode of the transistor M and the second electrode electrically connected to the conductive film ANO.

The switch SW21 includes the first terminal to which the first signal is supplied and includes the second terminal electrically connected to the gate electrode of the transistor M. The switch SW21 has a function of switching the conducting state or the non-conducting state on the basis of the first signal.

The capacitor C22 includes a first terminal electrically connected to the node N1($i,j$), and capacitor C22 includes a second terminal electrically connected to the switch SW22.

The switch SW22 includes a first terminal to which a second signal is supplied. Note that the switch SW22 has a function of switching a conducting state or a non-conducting state on the basis of the second signal.

Note that the switch SW22 is in the conducting state when the switch SW21 changes from the conducting state to the non-conducting state, the switch SW22 has a function of changing from the non-conducting state to the conducting state when the switch SW21 is in the non-conducting state, and the switch SW22 has a function of changing from the conducting state to the non-conducting state when the switch SW21 is in the non-conducting state.

The display element 550($i,j$) performs display on the basis of the potential VN of the node N1($i,j$).

Thus, a potential of the node N1($i,j$) can be controlled using the switch SW21 and the switch SW22. Alternatively, the potential of the node N1($i,j$) can be controlled using the switch SW21, and the potential of the node N1($i,j$) can be changed using the switch SW22. Alternatively, the changing potential can be supplied to the display element 550($i,j$). Alternatively, display can be performed on the basis of the changing potential. Alternatively, the display of the display element 550($i,j$) can be changed. Alternatively, an operation of the display element 550($i,j$) can be emphasized. Alternatively, the response of the display element 550($i,j$) can be made faster. As a result, a novel display panel that is highly convenient or reliable can be provided.

<<Structure Example 1 of Transistor>>

A bottom-gate transistor or a top-gate transistor can be used in the pixel circuit 530($i,j$), for example.

A transistor includes a semiconductor film 508, a conductive film 504, a conductive film 512A, and a conductive film 512B (see FIG. 5(B)).

The semiconductor film 508 includes a region 508A electrically connected to the conductive film 512A and a region 508B electrically connected to the conductive film 512B. The semiconductor film 508 includes a region 508C between the region 508A and the region 508B.

The conductive film 504 includes a region overlapping with the region 508C, and the conductive film 504 has a function of a gate electrode.

An insulating film 506 includes a region sandwiched between the semiconductor film 508 and the conductive film 504. The insulating film 506 has a function of a gate insulating film.

The conductive film 512A has one of a function of a source electrode and a function of a drain electrode, and the conductive film 512B has the other of the function of the source electrode and the function of the drain electrode.

A conductive film 524 can be used for the transistor. The conductive film 524 includes a region; between the region and the conductive film 504, the semiconductor film 508 is positioned. The conductive film 524 has a function of a second gate electrode. The conductive film 524 can be electrically connected to the conductive film 504, for example. Note that the conductive film 524 can be used as the scan line G21(i).

Note that in a process of forming the semiconductor film used in the transistor of the pixel circuit, the semiconductor film used in a transistor of a driver circuit can be formed.

<<Structure Example 1 of Semiconductor Film 508>>

A semiconductor containing a Group 14 element can be used for the semiconductor film 508, for example. Specifically, a semiconductor containing silicon can be used for the semiconductor film 508.

[Hydrogenated Amorphous Silicon]

For example, hydrogenated amorphous silicon can be used for the semiconductor film 508. Alternatively, microcrystalline silicon or the like can be used for the semiconductor film 508. Thus, a display panel having less display unevenness than a display panel that uses polysilicon for the semiconductor film 508, for example, can be provided. Alternatively, the size of the display panel can be easily increased.

[Polysilicon]

For example, polysilicon can be used for the semiconductor film 508. In this case, for example, the field-effect mobility of the transistor can be higher than that of a transistor that uses hydrogenated amorphous silicon for the semiconductor film 508. Alternatively, for example, the driving capability can be higher than that of a transistor that uses hydrogenated amorphous silicon for the semiconductor film 508. Alternatively, for example, the aperture ratio of the pixel can be higher than that in the case of using a transistor that uses hydrogenated amorphous silicon for the semiconductor film 508.

Alternatively, for example, the reliability of the transistor can be higher than that of a transistor that uses hydrogenated amorphous silicon for the semiconductor film 508.

Alternatively, the temperature required for fabrication of the transistor can be lower than that required for a transistor that uses single crystal silicon, for example.

Alternatively, the semiconductor film used for the transistor in the driver circuit can be formed through the same process as the semiconductor film used for the transistor in the pixel circuit. Alternatively, the driver circuit can be formed over the same substrate over which the pixel circuit is formed. Alternatively, the number of components included in an electronic device can be reduced.

[Single Crystal Silicon]

For example, single crystal silicon can be used for the semiconductor film. In this case, for example, the resolution can be higher than that of a display panel that uses hydrogenated amorphous silicon for the semiconductor film 508. Alternatively, for example, a display panel having less display unevenness than a display panel that uses polysilicon for the semiconductor film 508 can be provided. Alternatively, for example, smart glasses or a head mounted display can be provided.

<<Structure Example 2 of Semiconductor Film 508>>

For example, a metal oxide can be used for the semiconductor film 508. Thus, a pixel circuit can hold an image signal for a longer time than a pixel circuit utilizing a transistor that uses amorphous silicon for a semiconductor film. Specifically, a selection signal can be supplied at a frequency of lower than 30 Hz, preferably lower than 1 Hz, further preferably less than once per minute with the suppressed occurrence of flickers. Consequently, fatigue accumulation in a user of a data processing device can be reduced. Moreover, power consumption for driving can be reduced.

A transistor using an oxide semiconductor can be used, for example. Specifically, an oxide semiconductor containing indium or an oxide semiconductor containing indium, gallium, and zinc can be used for the semiconductor film.

A transistor having a lower leakage current in an off state than a transistor that uses amorphous silicon for a semiconductor film can be used, for example. Specifically, a transistor that uses an oxide semiconductor for a semiconductor film can be used.

A 25-nm-thick film containing indium, gallium, and zinc can be used as the semiconductor film 508, for example.

A conductive film in which a 10-nm-thick film containing tantalum and nitrogen and a 300-nm-thick film containing copper are stacked can be used as the conductive film 504, for example. Note that the film containing copper includes a region; between the region and the insulating film 506, the film containing tantalum and nitrogen is positioned.

A stacked-layer film in which a 400-nm-thick film containing silicon and nitrogen and a 200-nm-thick film containing silicon, oxygen, and nitrogen are stacked can be used for the insulating film 506, for example. Note that the film containing silicon and nitrogen includes a region; between the region and the semiconductor film 508, the film containing silicon, oxygen, and nitrogen is positioned.

A conductive film in which a 50-nm-thick film containing tungsten, a 400-nm-thick film containing aluminum, and a 100-nm-thick film containing titanium are stacked in this order can be used as the conductive film 512A or the conductive film 512B, for example. Note that the film containing tungsten includes a region in contact with the semiconductor film 508.

A manufacturing line for a bottom-gate transistor that uses amorphous silicon as a semiconductor can be easily remodeled into a manufacturing line for a bottom-gate transistor that uses an oxide semiconductor as a semiconductor, for example. Furthermore, for example, a manufacturing line for a top-gate transistor that uses polysilicon as a semiconductor can be easily remodeled into a manufacturing line for a top-gate transistor that uses an oxide semiconductor as a semiconductor. In either remodeling, an existing manufacturing line can be effectively utilized.

Accordingly, flickering can be suppressed. Alternatively, the power consumption can be reduced. Alternatively, a moving image with quick movements can be smoothly displayed. Alternatively, a photograph and the like can be displayed with a wide range of grayscale. As a result, a novel display panel that is highly convenient or reliable can be provided.

<<Structure Example 3 of Semiconductor Film 508>>

For example, a compound semiconductor can be used as the semiconductor of the transistor. Specifically, a semiconductor containing gallium arsenide can be used.

For example, an organic semiconductor can be used as the semiconductor of the transistor. Specifically, an organic semiconductor containing any of polyacenes or graphene can be used for the semiconductor film.

<<Structure Example 1 of Capacitor>>

A capacitor includes a plurality of conductive films and an insulating film. One conductive film overlaps with the other conductive film, and the insulating film has a region sandwiched between the conductive films.

For example, the conductive film 504, the conductive film 512A, and the insulating film 506 can be used in the capacitor.

<<Structure Example 2 of Functional Layer 520>>

The functional layer 520 includes an insulating film 521, an insulating film 518, an insulating film 516, the insulating film 506, an insulating film 501C, and the like (see FIG. 5(A)).

The insulating film 521 includes a region sandwiched between the pixel circuit 530(*i,j*) and the display element 550(*i,j*).

The insulating film 518 includes a region sandwiched between the insulating film 521 and the insulating film 501C.

The insulating film 516 includes a region sandwiched between the insulating film 518 and the insulating film 501C.

The insulating film 506 includes a region sandwiched between the insulating film 516 and the insulating film 501C.

[Insulating Film 521]

An insulating inorganic material, an insulating organic material, or an insulating composite material containing an inorganic material and an organic material, for example, can be used for the insulating film 521.

Specifically, an inorganic oxide film, an inorganic nitride film, an inorganic oxynitride film, or the like, or a stacked-layer material in which a plurality of films selected from these films are stacked can be used as the insulating film 521.

For example, a film including a silicon oxide film, a silicon nitride film, a silicon oxynitride film, an aluminum oxide film, or the like, or a film including a stacked-layer material in which a plurality of films selected from these films are stacked can be used as the insulating film 521. Note that the silicon nitride film is a dense film and has an excellent function of inhibiting diffusion of impurities.

For example, for the insulating film 521, polyester, polyolefin, polyamide, polyimide, polycarbonate, polysiloxane, an acrylic resin, or the like, or a stacked-layer material, a composite material, or the like of a plurality of resins selected from these resins can be used. Alternatively, a photosensitive material may be used. Thus, the insulating film 521 can planarize a level difference due to various components overlapping with the insulating film 521, for example.

Note that polyimide is excellent in thermal stability, insulating property, toughness, low dielectric constant, low coefficient of thermal expansion, chemical resistance, and other properties compared with other organic materials. Accordingly, in particular, polyimide can be suitably used for the insulating film 521 or the like.

For example, a film formed using a photosensitive material can be used as the insulating film 521. Specifically, a film formed using photosensitive polyimide, a photosensitive acrylic resin, or the like can be used as the insulating film 521.

[Insulating Film 518]

The material that can be used for the insulating film 521, for example, can be used for the insulating film 518.

For example, a material that has a function of inhibiting diffusion of oxygen, hydrogen, water, an alkali metal, an alkaline earth metal, and the like can be used for the insulating film 518. Specifically, a nitride insulating film can be used as the insulating film 518. For example, silicon nitride, silicon nitride oxide, aluminum nitride, aluminum nitride oxide, or the like can be used for the insulating film 518. Thus, diffusion of impurities to the semiconductor film of the transistor can be inhibited.

[Insulating Film 516]

The material that can be used for the insulating film 521, for example, can be used for the insulating film 516.

Specifically, a film formed by a fabrication method different from that of the insulating film 518 can be used as the insulating film 516.

[Insulating Film 506]

The material that can be used for the insulating film 521, for example, can be used for the insulating film 506.

Specifically, a film including a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, or a neodymium oxide film can be used as the insulating film 506.

[Insulating Film 501D]

An insulating film 501D includes a region sandwiched between the insulating film 501C and the insulating film 516.

The material that can be used for the insulating film 506, for example, can be used for the insulating film 501D.

[Insulating Film 501C]

The material that can be used for the insulating film 521, for example, can be used for the insulating film 501C. Specifically, a material containing silicon and oxygen can be used for the insulating film 501C. Thus, diffusion of impurities into the pixel circuit, the display element, or the like can be inhibited.

<<Structure Example 3 of Functional Layer 520>>

The functional layer 520 includes a conductive film, a wiring, and a terminal. A material having conductivity can be used for the wiring, an electrode, the terminal, the conductive film, or the like.

For example, an inorganic conductive material, an organic conductive material, a metal, a conductive ceramic, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese, or the like can be used for the wiring or the like. Alternatively, an alloy containing the above-described metal element, or the like can be used for the wiring or the like. In particular, an alloy of copper and manganese is suitable for microfabrication using a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure of a titanium film, an aluminum film stacked over the titanium film, and a titanium film further formed thereover, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film containing graphene oxide is formed and the film containing graphene oxide is reduced, so that a film containing graphene can be formed. As a reducing method, a method with application of heat, a method using a reducing agent, or the like can be given.

For example, a film including a metal nanowire can be used for the wiring or the like. Specifically, a nanowire containing silver can be used.

Specifically, a conductive high molecule can be used for the wiring or the like.

Note that a terminal 519B and a flexible printed board FPC1 can be electrically connected to each other using a conductive material ACF1, for example. Specifically, the terminal 519B and the flexible printed board FPC1 can be electrically connected to each other using a conductive material CP, for example.

<Structure Example 6 of Display Panel 700>

The display panel 700 includes an insulating film 528 (see FIG. 5(A)).

<<Insulating Film 528>>

The insulating film 528 includes a region sandwiched between the insulating film 521 and a base material 770 and includes an opening portion in a region overlapping with the display element 550($i,j$) (see FIG. 5(A)).

The material that can be used for the insulating film 521, for example, can be used for the insulating film 528. Specifically, a silicon oxide film, a film containing an acrylic resin, a film containing polyimide, or the like can be used as the insulating film 528.

<<Insulating Film 573>>

An insulating film 573 includes a region; between the region and the functional layer 520, the display element 550($i,j$) is positioned (see FIG. 5(A)).

For example, a single film or a stacked-layer film in which a plurality of films are stacked can be used as the insulating film 573. Specifically, a stacked-layer film in which an insulating film 573A formed by a method that hardly damages the display element 550($i,j$) and a dense insulating film 573B with a few defects are stacked can be used as the insulating film 573. This can inhibit diffusion of impurities into the display element 550($i,j$).

<<Structure Example 2 of Display Element 550($i,j$)>>

The display element 550($i,j$) has a function of emitting light.

The display element 550($i,j$) includes a layer 553($j$) containing a light-emitting material (see FIG. 5(A)).

A display element having a function of emitting light, for example, can be used as the display element 550($i,j$). Specifically, an organic electroluminescence element, an inorganic electroluminescence element, a light-emitting diode, a QDLED (Quantum Dot LED), or the like can be used as the display element 550($i,j$).

<<Structure Example 1 of Layer 553($j$) Containing Light-Emitting Material>>

A belt-like stacked-layer material that is long in the column direction along the signal line S21($j$) can be used for the layer 553($j$) containing a light-emitting material, for example.

Specifically, materials emitting light with different hues can be used for the layer 553($j$) containing a light-emitting material, a layer 553($j$+1) containing a light-emitting material, and a layer 553($j$+2) containing a light-emitting material. Thus, for example, the hue of the light emitted from the display element 550($i,j$) can be different between columns.

For example, a material that emits blue light, a material that emits green light, and a material that emits red light can be used as the materials emitting light with different hues.

<<Structure Example 2 of Layer 553($j$) Containing Light-Emitting Material>>

A stacked-layer material stacked to emit white light can be used for the layer 553($j$) containing a light-emitting material, for example.

Specifically, materials emitting light with different hues can be used for the layer 553($j$) containing a light-emitting material.

For example, a stacked-layer material in which a layer containing a light-emitting material including a fluorescent substance that emits blue light and a layer containing materials that are other than fluorescent substances and that emit green light and red light are stacked can be used for the layer 553($j$) containing a light-emitting material. Alternatively, a stacked-layer material in which a layer containing a material that is other than a fluorescent substance and that emits yellow light is stacked can be used for the layer 553($j$) containing a light-emitting material.

A light-emitting unit can be used for the layer 553($j$) containing a light-emitting material, for example. The light-emitting unit includes one region where electrons injected from one side are recombined with holes injected from the other side. The light-emitting unit contains a light-emitting material, and the light-emitting material releases energy generated by recombination of electrons and holes as light.

A plurality of light-emitting units and an intermediate layer can be used for the layer 553($j$) containing a light-emitting material, for example. The intermediate layer includes a region sandwiched between two light-emitting units. The intermediate layer includes a charge-generation region, and the intermediate layer has functions of supplying holes to the light-emitting unit provided on the cathode side and supplying electrons to the light-emitting unit provided on the anode side. Furthermore, a structure including a plurality of light-emitting units and an intermediate layer is referred to as a tandem light-emitting element in some cases.

For example, a light-emitting unit containing a material emitting light with one hue and a light-emitting unit containing a material emitting light with a different hue can be used for the layer 553($j$) containing a light-emitting material.

For example, a high molecular compound (e.g., an oligomer, a dendrimer, or a polymer), a middle molecular compound (a compound between a low molecular compound and a high molecular compound with a molecular weight greater than or equal to 400 and less than or equal to 4000), or the like can be used for the layer 553($j$) containing a light-emitting material.

<<Electrode 551($i,j$) and Electrode 552>>

An electrode 551($i,j$) is electrically connected to the pixel circuit 530($i,j$) in the opening portion 591A (see FIG. 4(A) or FIG. 5(A)).

The electrode 551(i,j) is provided with the insulating film 528 in the periphery. In other words, the insulating film 528 includes an opening portion, and the electrode 551(i,j) overlaps with the opening portion. Thus, a short circuit between the electrode 551(i,j) and an electrode 552 can be prevented.

For example, the material that can be used for the wiring or the like can be used for the electrode 551(i,j) or the electrode 552. Specifically, a material that has a visible-light-transmitting property can be used for the electrode 551(i,j) or the electrode 552.

For example, a conductive oxide, a conductive oxide containing indium, indium oxide, indium tin oxide, indium zinc oxide, zinc oxide, zinc oxide to which gallium is added, or the like can be used. Alternatively, a metal film thin enough to transmit light can be used. Alternatively, a material that has a visible-light-transmitting property can be used.

For example, a metal film that transmits part of light and reflects another part of the light can be used for the electrode 551(i,j) or the electrode 552. Thus, for example, the distance between the electrode 551(i,j) and the electrode 552 can be adjusted. Alternatively, a microcavity structure can be provided in the display element 550(i,j). Alternatively, light of a predetermined wavelength can be extracted more efficiently than other light. Alternatively, light with a narrow half width of a spectrum can be extracted. Alternatively, light of a bright color can be extracted.

For example, a film that reflects light efficiently can be used for the electrode 551(i,j) or the electrode 552. Specifically, a material containing silver, palladium, and the like or a material containing silver, copper, and the like can be used for the metal film.

<Structure Example 7 of Display Panel 700>

The display panel 700 includes a base material 510, the base material 770, and a sealant 705 (see FIG. 5(A)). In addition, the display panel 700 includes a functional film 770P.

<<Base Material 510 and Base Material 770>>

A light-transmitting material can be used for the base material 510 or the base material 770.

For example, a flexible material can be used for the base material 510 or the base material 770. Thus, a flexible display panel can be provided.

For example, a material with a thickness less than or equal to 0.7 mm and greater than or equal to 0.1 mm can be used. Specifically, a material polished to a thickness of approximately 0.1 mm can be used. Thus, the weight can be reduced.

For example, a glass substrate of the 6th generation (1500 mm×1850 mm), the 7th generation (1870 mm×2200 mm), the 8th generation (2200 mm×2400 mm), the 9th generation (2400 mm×2800 mm), the 10th generation (2950 mm×3400 mm), or the like can be used as the base material 510 or the base material 770. Thus, a large-sized display device can be fabricated.

For the base material 510 or the base material 770, an organic material, an inorganic material, a composite material of an organic material and an inorganic material or the like, or the like can be used.

For example, an inorganic material such as glass, ceramic, or a metal can be used. Specifically, non-alkali glass, soda-lime glass, potash glass, crystal glass, aluminosilicate glass, tempered glass, chemically tempered glass, quartz, sapphire, or the like can be used for the base material 510 or the base material 770. Alternatively, aluminosilicate glass, tempered glass, chemically tempered glass, sapphire, or the like can be suitably used for the base material 510 or the base material 770 that is provided on the side close to a user of the display panel. Thus, the display panel can be prevented from being broken or damaged by the use thereof.

Specifically, an inorganic oxide film, an inorganic nitride film, an inorganic oxynitride film, or the like can be used. For example, a silicon oxide film, a silicon nitride film, a silicon oxynitride film, an aluminum oxide film, or the like can be used. Stainless steel, aluminum, or the like can be used for the base material 510 or the base material 770.

For example, a single crystal semiconductor substrate of silicon or silicon carbide, a polycrystalline semiconductor substrate, a compound semiconductor substrate of silicon germanium or the like, an SOI substrate, or the like can be used as the base material 510 or the base material 770. Thus, a semiconductor element can be formed over the base material 510 or the base material 770.

For example, an organic material such as resin, a resin film, or plastic can be used for the base material 510 or the base material 770. Specifically, a material containing polyester, polyolefin, polyamide (nylon, aramid, or the like), polyimide, polycarbonate, polyurethane, an acrylic resin, an epoxy resin, or a resin having a siloxane bond can be used for the base material 510 or the base material 770. For example, a resin film, a resin plate, a stacked-layer material, or the like containing any of these materials can be used. Thus, the weight can be reduced. Alternatively, for example, the frequency of occurrence of breakage or the like due to dropping can be reduced.

Specifically, polyethylene terephthalate (PET), polyethylene naphthalate (PEN), polyethersulfone (PES), a cycloolefin polymer (COP), a cycloolefin copolymer (COC), or the like can be used for the base material 510 or the base material 770.

For example, a composite material formed by attaching a metal plate, a thin glass plate, or a film of an inorganic material or the like and a resin film or the like to each other can be used for the base material 510 or the base material 770. For example, a composite material formed by dispersing a fibrous or particulate metal, glass, an inorganic material, or the like into resin can be used for the base material 510 or the base material 770. For example, a composite material formed by dispersing a fibrous or particulate resin, an organic material, or the like into an inorganic material can be used for the base material 510 or the base material 770.

Furthermore, a single-layer material or a material in which a plurality of layers are stacked can be used for the base material 510 or the base material 770. For example, a material in which insulating films and the like are stacked can be used. Specifically, a material in which one or a plurality of films selected from a silicon oxide layer, a silicon nitride layer, a silicon oxynitride layer, and the like are stacked can be used. Thus, diffusion of impurities contained in the base materials can be prevented, for example. Alternatively, diffusion of impurities contained in glass or resin can be prevented. Alternatively, diffusion of impurities that pass through resin can be prevented.

Furthermore, paper, wood, or the like can be used for the base material 510 or the base material 770.

For example, a material having heat resistance high enough to withstand heat treatment in the fabricating process can be used for the base material 510 or the base material 770. Specifically, a material having heat resistance to heat applied in the process of directly forming the transistor, the capacitor, or the like can be used for the base material 510 or the base material 770.

For example, a method in which an insulating film, a transistor, a capacitor, or the like is formed on a substrate which is for use in the process and has heat resistance to heat applied in the fabricating process, and the formed insulating film, transistor, capacitor, or the like is transferred to the base material 510 or the base material 770 can be used. Accordingly, an insulating film, a transistor, a capacitor, or the like can be formed on a flexible substrate, for example.

<<Sealant 705>>

The sealant 705 includes a region sandwiched between the functional layer 520 and the base material 770 and has a function of bonding the functional layer 520 and the base material 770 together.

An inorganic material, an organic material, a composite material of an inorganic material and an organic material, or the like can be used for the sealant 705.

For example, an organic material such as a thermally fusible resin or a curable resin can be used for the sealant 705.

For example, an organic material such as a reactive curable adhesive, a photocurable adhesive, a thermosetting adhesive, and/or an anaerobic adhesive can be used for the sealant 705.

Specifically, an adhesive containing an epoxy resin, an acrylic resin, a silicone resin, a phenol resin, a polyimide resin, an imide resin, a PVC (polyvinyl chloride) resin, a PVB (polyvinyl butyral) resin, an EVA (ethylene vinyl acetate) resin, or the like can be used for the sealant 705.

<Structure Example 8 of Display Panel 700>

The display panel 700 includes a functional layer 720 and the functional film 770P (see FIG. 5(A)).

<<Functional Layer 720>>

The functional layer 720 includes the absorption layer CF(j), an insulating film 771, the color conversion layer CC(j), and a light-blocking film BM.

The absorption layer CF(j) includes a region sandwiched between the base material 770 and the display element 550(i,j). The color conversion layer CC(j) includes a region sandwiched between the absorption layer CF(j) and the display element 550(i,j).

For example, a material that selectively transmits light of a predetermined color can be used for the absorption layer CF(j). Specifically, a material that transmits red light, green light, or blue light can be used for the absorption layer CF(j).

For example, a material that emits light with a wavelength longer than that of incident light can be used for the color conversion layer CC(j). For example, a material that absorbs blue light or ultraviolet light, converts it into green light, and releases the green light, a material that absorbs blue light or ultraviolet light, converts it into red light, and releases the red light, or a material that absorbs ultraviolet light, converts it into blue light, and releases the blue light can be used for the color conversion layer. Specifically, a quantum dot with a diameter of several nanometers can be used for the color conversion layer. Thus, light having a spectrum with a narrow half width can be extracted. Alternatively, light with high saturation can be released. The light-blocking film BM includes an opening portion in a region overlapping with the pixel 702(i,j).

For example, a liquid repellent material with respect to a solution containing a material used for the absorption layer CF(j) can be used for the insulating film 771. Specifically, a material whose contact angle is more than or equal to 90° with respect to the solution can be used for the insulating film 771. For example, a material containing fluorine, silicon, or the like can be used for the insulating film 771. Thus, the absorption layer CF(j) can be formed by an ink-jet method or the like. Alternatively, the manufacturing cost of the absorption layer CF(j) can be reduced.

In addition, for example, a liquid repellent material with respect to a solution containing a material used for the color conversion layer CC(j) can be used for the insulating film 771.

<<Functional Film 770P and the Like>>

The functional film 770P includes a region overlapping with the display element 550(i,j).

An anti-reflection film, a polarizing film, a retardation film, a light diffusion film, a condensing film, or the like can be used as the functional film 770P, for example.

For example, an anti-reflection film with a thickness of less than or equal to 1 μm can be used as the functional film 770P. Specifically, a stacked-layer film in which three or more layers, preferably five or more layers, further preferably 15 or more layers of dielectrics are stacked can be used as the functional film 770P. This allows the reflectivity to be as low as 0.5% or less, preferably 0.08% or less.

Specifically, a circularly polarizing film can be used as the functional film 770P.

Furthermore, an antistatic film inhibiting the attachment of a dust, a water repellent film inhibiting the attachment of a stain, an antireflective film (anti-reflection film), a non-glare film (anti-glare film), a hard coat film inhibiting generation of a scratch in use, or the like can be used as the functional film 770P.

Note that this embodiment can be combined with other embodiments in this specification as appropriate.

Embodiment 2

Figure 6A:
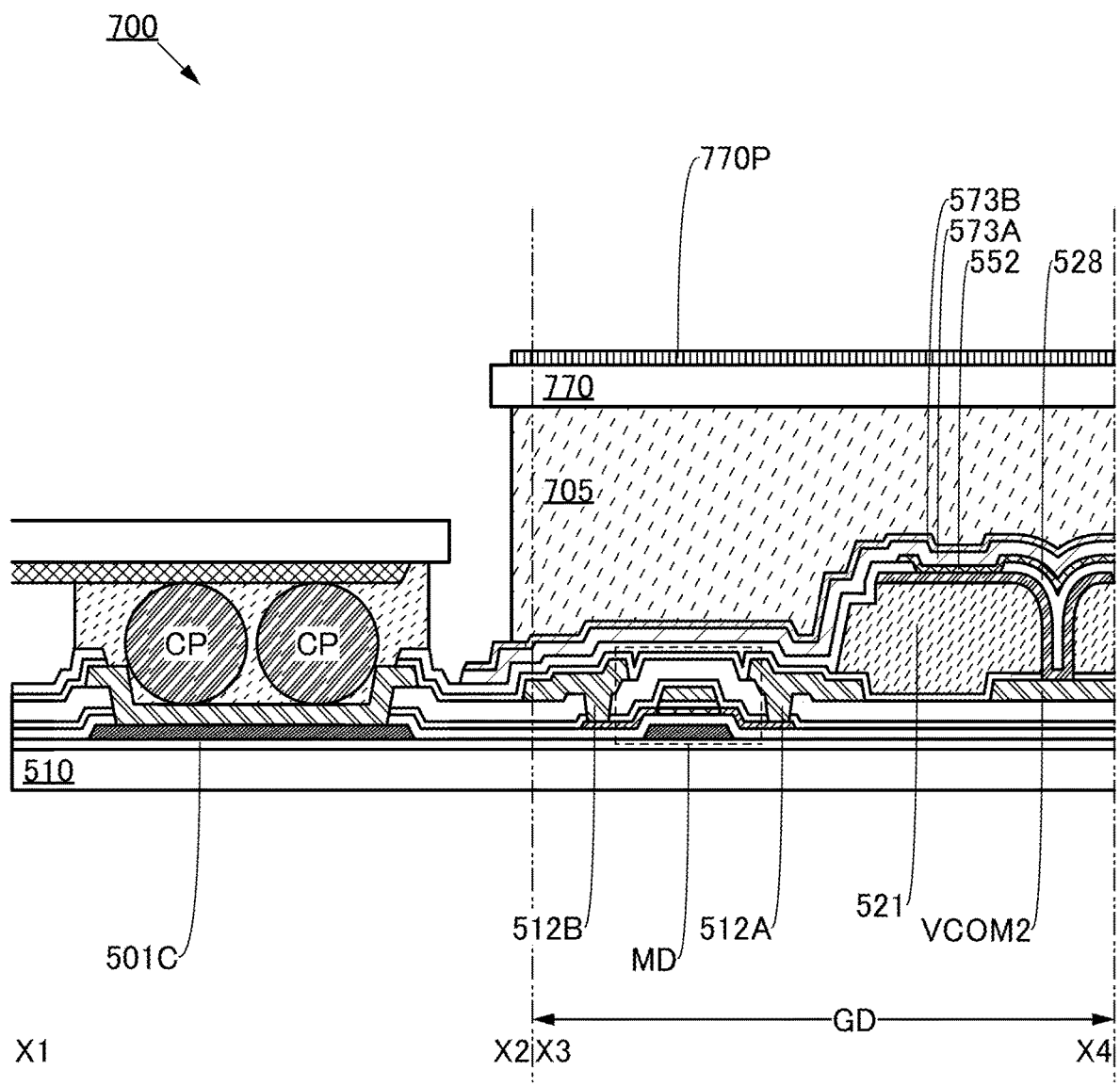
FIGS. 6(A) and (B) Cross-sectional views illustrating a structure of a display panel of an embodiment.
Figure 6B:
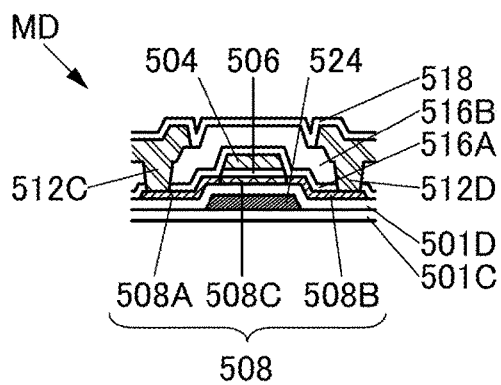

In this embodiment, structures of the display panel of one embodiment of the present invention will be described with reference to FIG. 3, FIG. 6, and FIG. 7.

Figure 7:
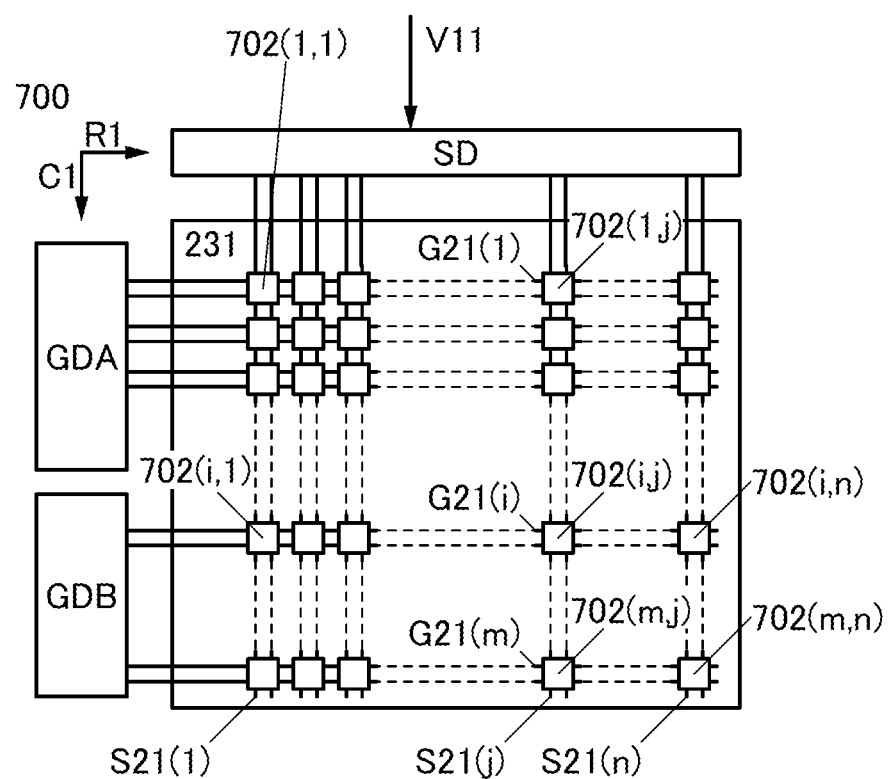
FIG. 7 A block diagram illustrating a structure of a display panel of an embodiment.

FIG. 7 shows a structure of the display panel of one embodiment of the present invention.

<Structure Example 1 of Display Panel>

The display panel 700 described in this embodiment includes the display region 231 (see FIG. 7).

<<Structure Example 1 of Display Region 231>>

The display region 231 includes a group of pixels 702(i,1) to 702(i,n), a different group of pixels 702(1,j) to 702(m,j), the scan line G21(i), and the signal line S21(j) (see FIG. 7). Note that i is an integer greater than or equal to 1 and less than or equal to m, j is an integer greater than or equal to 1 and less than or equal to n, and m and n are each an integer greater than or equal to 1.

Although not illustrated, the display region 231 includes a conductive film VCOM2 and the conductive film ANO.

The group of pixels 702(i,1) to 702(i,n) are arranged in the row direction (the direction indicated by an arrow R1 in the drawing) and include the pixel 702(i,j).

The different group of pixels 702(1,j) to 702(m,j) are arranged in the column direction intersecting the row direction (the direction indicated by an arrow C1 in the drawing) and include the pixel 702(i,j).

The scan line G21(i) is electrically connected to the group of pixels 702(i,1) to 702(i,n) arranged in the row direction.

The signal line S21(j) is electrically connected to the different group of pixels 702(1,j) to 702(m,j) arranged in the column direction.

Thus, image data can be supplied to a plurality of pixels. As a result, a novel display panel that is highly convenient or reliable can be provided.

<<Structure Example 2 of Display Region 231>>

The display region 231 includes a plurality of pixels in a matrix. For example, the display region 231 includes 7600 or more pixels in the row direction and 4300 or more pixels in the column direction. Specifically, 7680 pixels are provided in the row direction and 4320 pixels are provided in the column direction.

<<Structure Example 3 of Display Region 231>>

The diagonal size of the display region 231 is greater than or equal to 40 inches, preferably greater than or equal to 60 inches, further preferably greater than or equal to 80 inches. The diagonal size of the display region 231 is preferably less than or equal to, for example, 150 inches because the weight can be reduced.

Thus, a high-resolution image can be displayed. As a result, a novel display panel that is highly convenient or reliable can be provided.

<<Structure Example 4 of Display Region 231>>

The display region 231 includes a plurality of pixels. The plurality of pixels have a function of displaying colors with different hues. Alternatively, colors with hues that cannot be displayed by each of the plurality of pixels can be displayed by additive color mixture using the plurality of pixels.

Note that when a plurality of pixels capable of displaying colors with different hues are used for color mixture, each of the pixels can be rephrased as a subpixel. In addition, a set of subpixels can be rephrased as a pixel.

For example, the pixel 702($i,j$) can be rephrased as a subpixel, and a set of the pixel 702($i,j$), the pixel 702($i,j$+1), and the pixel 702($i,j$+2) can be rephrased as a pixel 703($i,k$) (see FIG. 3(C)).

Specifically, a set of a subpixel that displays blue, a subpixel that displays green, and a subpixel that displays red can be used as the pixel 703($i,k$). A set of a subpixel that displays cyan, a subpixel that displays magenta, and a subpixel that displays yellow can be used as the pixel 703($i,k$).

Furthermore, the above set to which a subpixel that displays white or the like is added can be used as the pixel, for example.

<Structure Example 2 of Display Panel>

The display panel 700 described in this embodiment includes one or more driver circuits. For example, a driver circuit GD and a driver circuit SD can be included (see FIG. 7).

<<Driver Circuit GDA and Driver Circuit GDB>>

A driver circuit GDA and a driver circuit GDB can be used as the driver circuit GD. For example, the driver circuit GDA and the driver circuit GDB each have a function of supplying a selection signal on the basis of control data.

Specifically, the driver circuit GDA and the driver circuit GDB have a function of supplying a selection signal to one scan line at a frequency of 30 Hz or higher, preferably 60 Hz or higher, on the basis of the control data. Accordingly, a moving image can be smoothly displayed.

Alternatively, the driver circuit GDA and the driver circuit GDB have a function of supplying a selection signal to one scan line at a frequency lower than 30 Hz, preferably lower than 1 Hz, further preferably less than once a minute, on the basis of the control data. Accordingly, a still image in which flickering is reduced can be displayed.

In the case where a plurality of driver circuits are provided, for example, the frequency at which the driver circuit GDA supplies a selection signal and the frequency at which the driver circuit GDB supplies a selection signal can be made different from each other. Specifically, the selection signal can be supplied at a higher frequency to a region on which a moving image is displayed than to a region on which a still image is displayed. Accordingly, a still image in which flickering is reduced can be displayed on a region, and a moving image can be smoothly displayed on another region.

The frame frequency can be variable. For example, display can be performed at a frame frequency of higher than or equal to 1 Hz and lower than or equal to 120 Hz. Alternatively, display can be performed at a frame frequency of 120 Hz by a progressive method.

A bottom-gate transistor, a top-gate transistor, or the like can be used in the driver circuit GD, for example. Specifically, a transistor MD can be used in the driver circuit GD (see FIG. 6).

Note that for example, a semiconductor film used for a transistor in the driver circuit GD can be formed in a process of forming a semiconductor film used for a transistor in the pixel circuit 530($i,j$).

<<Driver Circuit SD>>

The driver circuit SD has a function of generating an image signal on the basis of data V11 and a function of supplying the image signal to a pixel circuit electrically connected to one display element (see FIG. 7).

A variety of sequential circuits or the like, such as a shift register, can be used as the driver circuit SD, for example.

For example, an integrated circuit formed on a silicon substrate can be used as the driver circuit SD.

An integrated circuit can be connected to a terminal by a COG (Chip on glass) method or a COF (Chip on Film) method, for example. Specifically, an anisotropic conductive film can be used to connect an integrated circuit to a terminal.

Note that this embodiment can be combined with other embodiments in this specification as appropriate.

Embodiment 3

In this embodiment, a structure of a display device of one embodiment of the present invention will be described with reference to FIG. 8.

FIG. 8 shows the structure of the display device of one embodiment of the present invention. FIG. 8(A) is a block diagram of the display device of one embodiment of the present invention, and FIG. 8(B-1) to FIG. 8(B-3) are projection views illustrating the appearance of the display device of one embodiment of the present invention.

<Structure Example of Display Device>

Figure 8A:
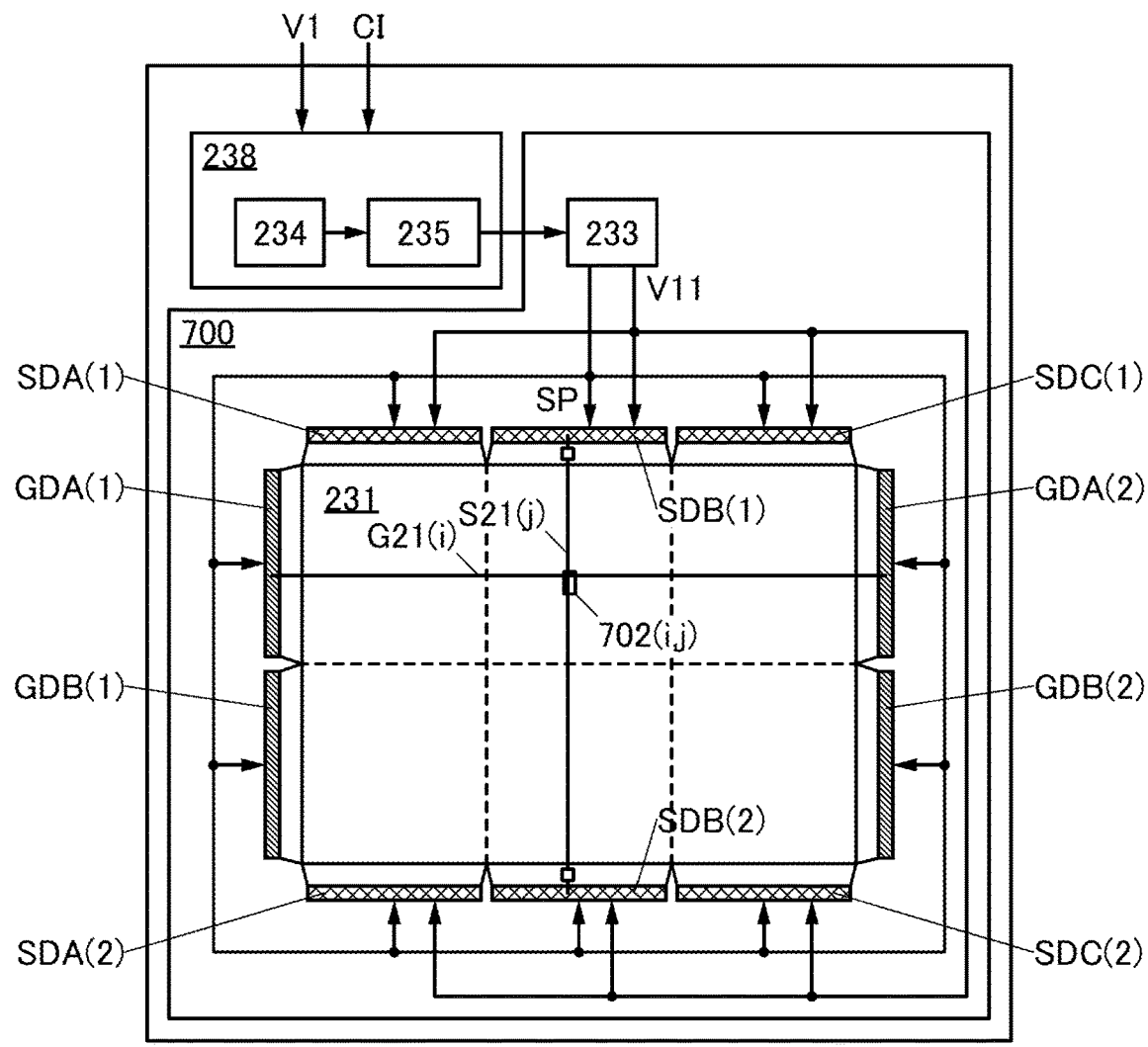
FIGS. 8(A) and (B-1) to (B-3) Diagrams illustrating a structure of a display device of an embodiment.
Figure 8A:
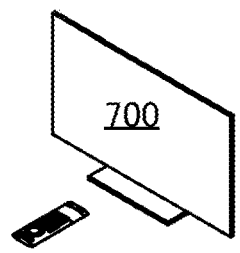
Figure 8A:
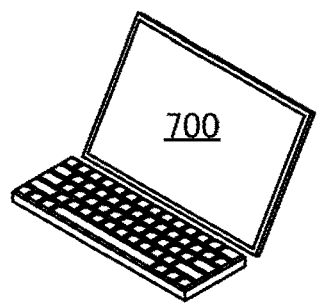
Figure 8A:
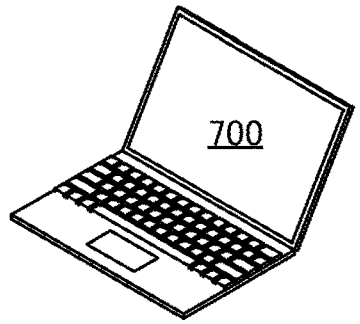

The display device described in this embodiment includes a control portion 238 and the display panel 700 (see FIG. 8(A)).

<<Structure Example 1 of Control Portion 238>>

The control portion 238 is supplied with image data V1 and control data CI. For example, a clock signal, a timing signal, or the like can be used as the control data CI.

The control portion 238 generates the data V11 on the basis of the image data V1 and generates a control signal SP on the basis of the control data CI. Furthermore, the control portion 238 supplies the data V11 and the control signal SP.

The data V11 includes a grayscale of 8 bits or more, preferably 12 bits or more, for example. In addition, a clock signal, a start pulse, or the like of a shift register used for a driver circuit can be used as the control signal SP, for example.

<Structure Example 2 of Control Portion 238>

For example, a decompression circuit 234 and an image processing circuit 235 can be used for the control portion 238.

<<Decompression Circuit 234>>

The decompression circuit 234 has a function of decompressing the image data V1 supplied in a compressed state. The decompression circuit 234 includes a memory portion. The memory portion has a function of storing decompressed image data, for example.

<<Image Processing Circuit 235>>

The image processing circuit 235 includes a memory region, for example. The memory region has a function of storing data included in the image data V1, for example.

The image processing circuit 235 has a function of generating the data V11 by correcting the image data V1 on the basis of a predetermined characteristic curve and a function of supplying the data V11, for example.

<<Structure Example 1 of Display Panel>>

The display panel 700 is supplied with the data V11 and the control signal SP. For example, a driver circuit can be used for the display panel 700. Specifically, the display panel 700 described in Embodiment 2 can be used.

<<Driver Circuit>>

The driver circuit operates on the basis of the control signal SP. Using the control signal SP enables a synchronized operation of a plurality of driver circuits.

For example, a driver circuit GDA(1), a driver circuit GDA(2), a driver circuit GDB(1), and a driver circuit GDB(2) can be used for the display panel. The driver circuit GDA(1), the driver circuit GDA(2), the driver circuit GDB(1), and the driver circuit GDB(2) are supplied with the control signal SP and have a function of supplying a selection signal.

For example, a driver circuit SDA(1), a driver circuit SDA(2), a driver circuit SDB(1), a driver circuit SDB(2), a driver circuit SDC(1), and a driver circuit SDC(2) can be used for the display panel. The driver circuit SDA(1), the driver circuit SDA(2), the driver circuit SDB(1), the driver circuit SDB(2), the driver circuit SDC(1), and the driver circuit SDC(2) are supplied with the control signal SP and the data V11 and capable of supplying an image signal.

<<Structure Example 3 of Pixel $702(i,j)$>>

The pixel $702(i,j)$ performs display on the basis of the data V11.

Thus, the image data can be displayed using the display element. As a result, a novel display device that is highly convenient or reliable can be provided. Alternatively, for example, a television receiver system (see FIG. 8(B-1)), a video monitor (see FIG. 8(B-2)), a laptop computer (see FIG. 8(B-3)), or the like can be provided.

<<Structure Example 2 of Display Panel>>

For example, a control circuit 233 can be used in the display panel 700. Specifically, the control circuit 233 formed over a rigid substrate can be used for the display panel 700. The control circuit 233 formed over a rigid substrate can be electrically connected to the control portion 238 using a flexible printed board.

<<Control Circuit 233>>

The control circuit 233 has a function of generating and supplying the control signal SP. For example, a clock signal, a timing signal, or the like can be used as the control signal SP. Specifically, a timing controller can be used as the control circuit 233.

Note that this embodiment can be combined with other embodiments in this specification as appropriate.

Embodiment 4

In this embodiment, a structure of an input/output device of one embodiment of the present invention will be described with reference to FIG. 9.

Figure 9:
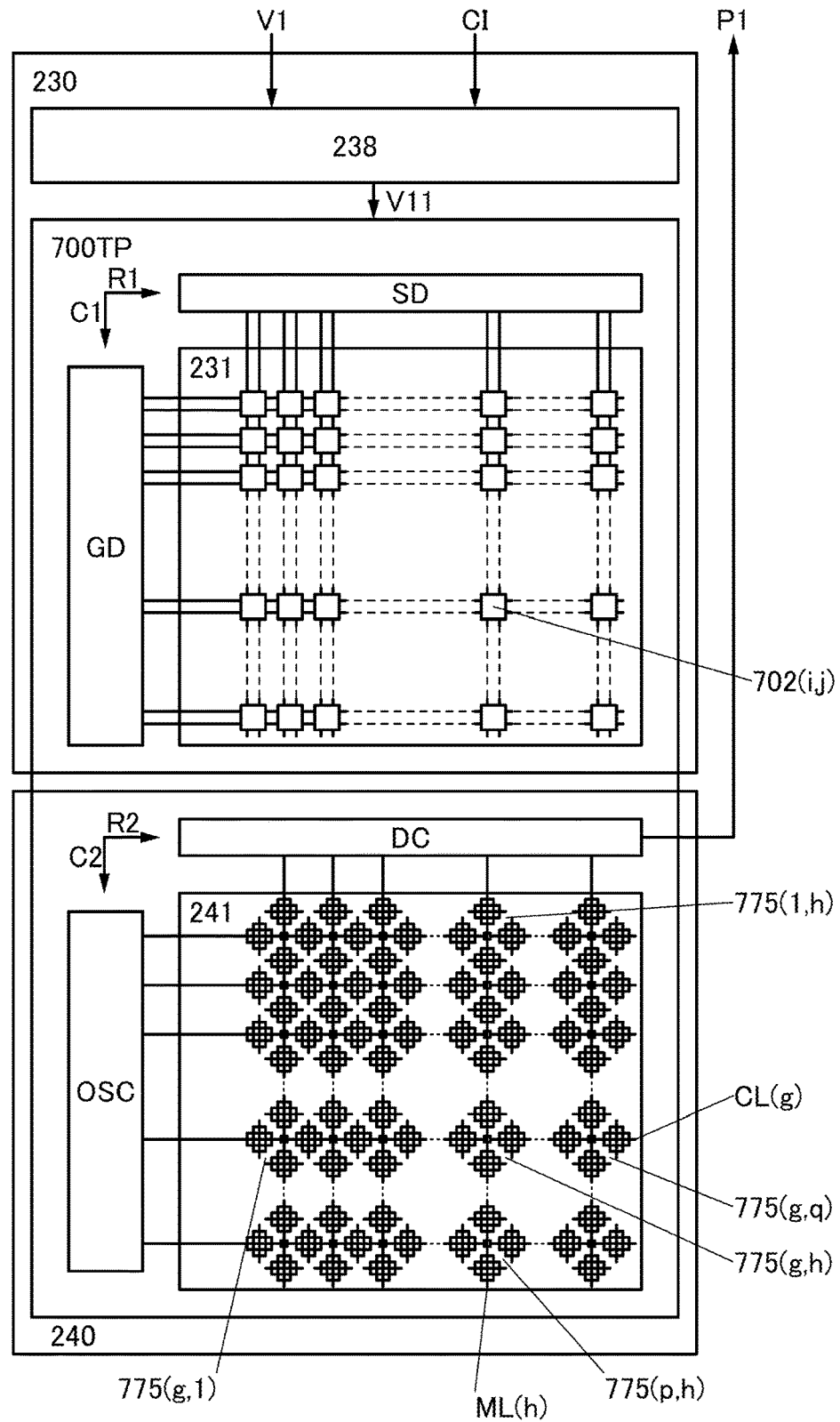
FIG. 9 A block diagram illustrating a structure of an input/output device of an embodiment.

FIG. 9 is a block diagram illustrating the structure of the input/output device of one embodiment of the present invention.

<Structure Example of Input/Output Device>

The input/output device described in this embodiment includes an input portion 240 and a display portion 230 (see FIG. 9).

<<Display Portion 230>>

The display portion 230 includes a display panel. For example, the display panel 700 described in Embodiment 1 or Embodiment 2 can be used for the display portion 230. Note that a structure including the input portion 240 and the display portion 230 can be referred to as an input/output panel 700TP.

<<Structure Example 1 of Input Portion 240>>

The input portion 240 includes a sensing region 241. The input portion 240 has a function of sensing an object approaching the sensing region 241.

The sensing region 241 includes a region overlapping with the pixel $702(i,j)$.

Thus, the object approaching the region overlapping with the display portion can be sensed while image data is displayed by the display portion. Alternatively, a finger or the like that approaches the display portion can be used as a pointer to input positional data. Alternatively, positional data can be associated with image data displayed on the display portion. As a result, a novel input/output device that is highly convenient or reliable can be provided.

<<Structure Example 2 of Input Portion 240>>

The input portion 240 includes an oscillation circuit OSC and a sensing circuit DC (see FIG. 9).

<<Sensing Region 241>>

The sensing region 241 includes one or more sensing elements, for example.

The sensing region 241 includes a group of sensing elements $775(g,1)$ to $775(g,q)$ and a different group of sensing elements $775(1,h)$ to $775(p,h)$. Note that g is an integer greater than or equal to 1 and less than or equal to p, h is an integer greater than or equal to 1 and less than or equal to q, and p and q are each an integer greater than or equal to 1.

The group of sensing elements $775(g,1)$ to $775(g,q)$ include a sensing element $775(g,h)$ and are arranged in the row direction (the direction indicated by an arrow R2 in the drawing). Note that the direction indicated by the arrow R2 may be the same as or different from the direction indicated by the arrow R1.

The different group of sensing elements $775(1,h)$ to $775(p,h)$ include the sensing element $775(g,h)$ and are arranged in the column direction (the direction indicated by an arrow C2 in the drawing) that intersects the row direction.

<<Sensing Element>>

The sensing element has a function of sensing an approaching pointer. For example, a finger, a stylus pen, or the like can be used as the pointer. For example, a piece of metal, a coil, or the like can be used for the stylus pen.

Specifically, a capacitive proximity sensor, an electromagnetic inductive proximity sensor, an optical proximity sensor, a resistive proximity sensor, or the like can be used as the sensing element.

A plurality of types of sensing elements can be used in combination. For example, a sensing element that senses a finger and a sensing element that senses a stylus pen can be used in combination.

This allows determination of the kind of a pointer. Alternatively, different instructions can be associated with pieces of sensing data depending on the kind of a pointer that has been determined. Specifically, in the case where it is determined that a finger is used as a pointer, sensing data can be associated with a gesture. Alternatively, in the case where it is determined that a stylus pen is used as a pointer, sensing data can be associated with drawing processing.

Specifically, a capacitive proximity sensor or an optical proximity sensor can be used to sense a finger. Alternatively, an electromagnetic inductive proximity sensor or an optical proximity sensor can be used to sense a stylus pen.

Note that this embodiment can be combined with other embodiments in this specification as appropriate.

Embodiment 5

In this embodiment, structures of a data processing device of one embodiment of the present invention will be described with reference to FIG. 10 to FIG. 12.

Figure 10A:
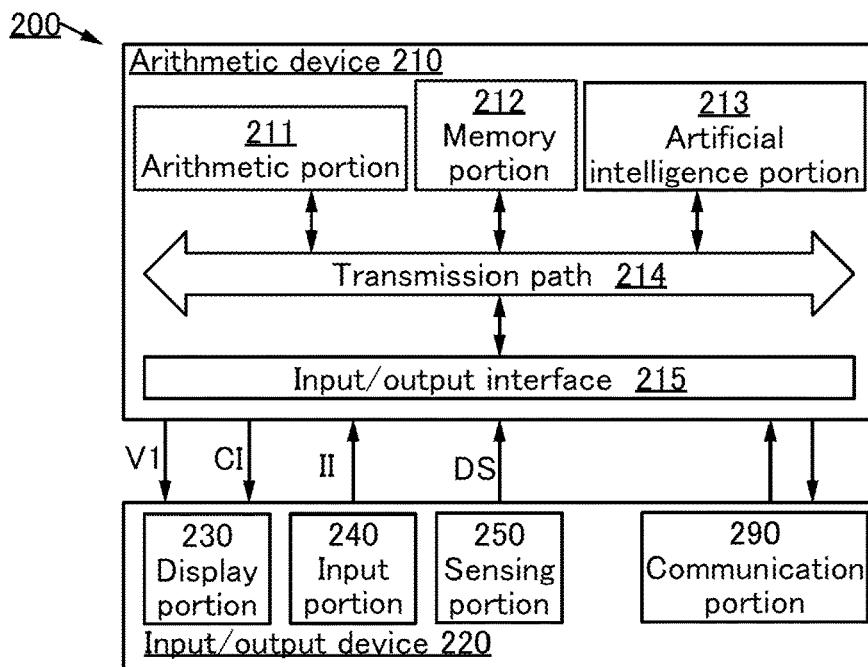
FIG. 10(A) to (C) A block diagram and projection views illustrating a structure of a data processing device of an embodiment.
Figure 10B:
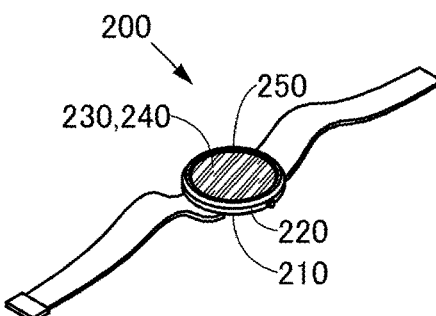
Figure 10C:
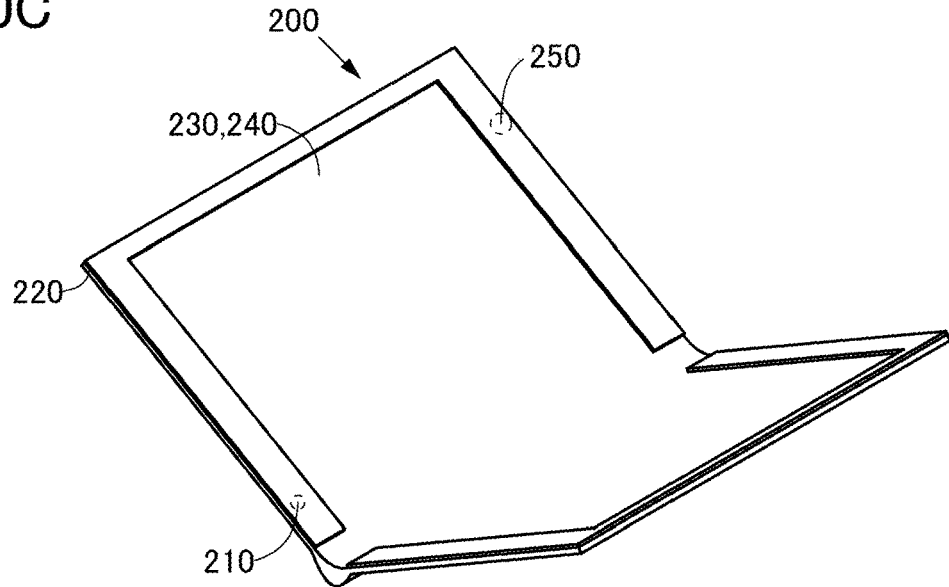

FIG. 10(A) is a block diagram illustrating the structure of the data processing device of one embodiment of the present invention. FIG. 10(B) and FIG. 10(C) are projection views illustrating examples of the appearance of the data processing device.

Figure 11A:
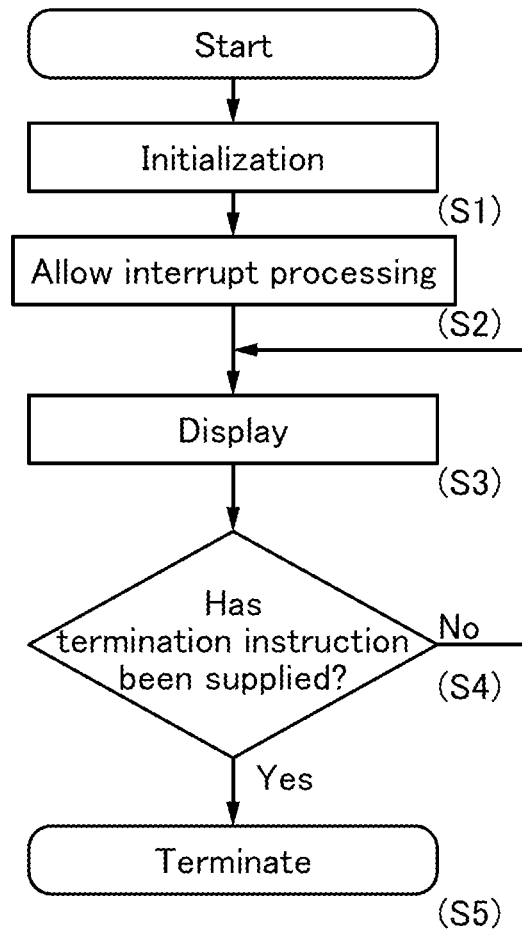
FIGS. 11(A) and (B) Flow charts illustrating a method for driving a data processing device of an embodiment.
Figure 11B:
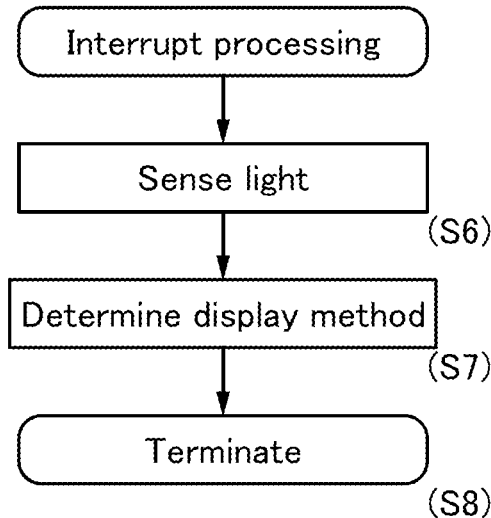

FIG. 11 is a flow chart illustrating a program of one embodiment of the present invention. FIG. 11(A) is a flow chart illustrating main processing of the program of one embodiment of the present invention, and FIG. 11(B) is a flow chart illustrating interrupt processing.

Figure 12A:
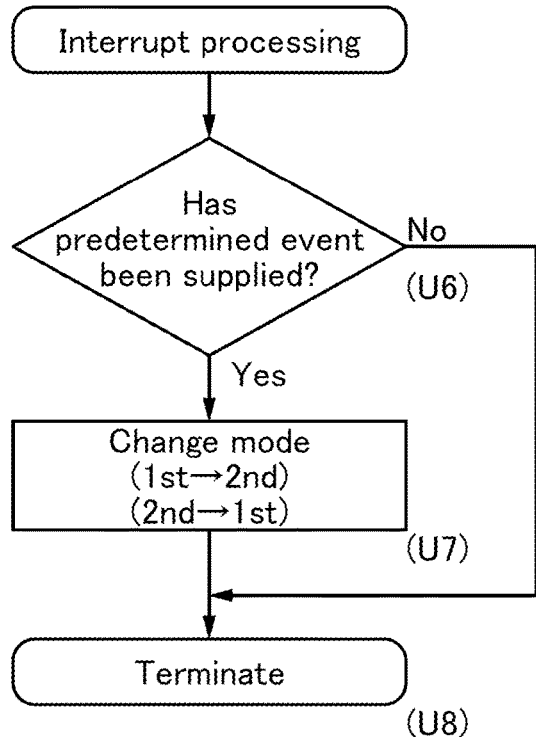
FIG. 12(A) to (C) Diagrams illustrating a method for driving a data processing device of an embodiment.
Figure 12B:
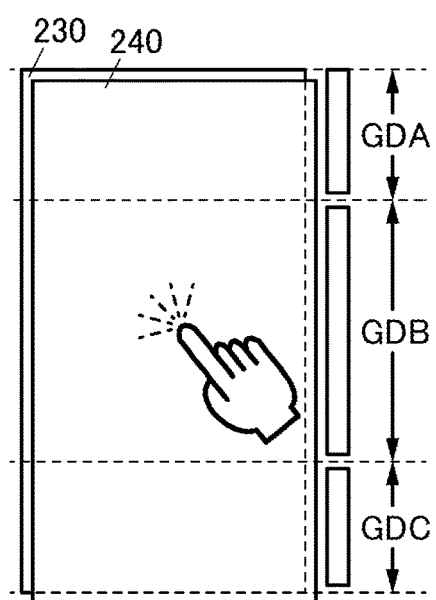
Figure 12C:
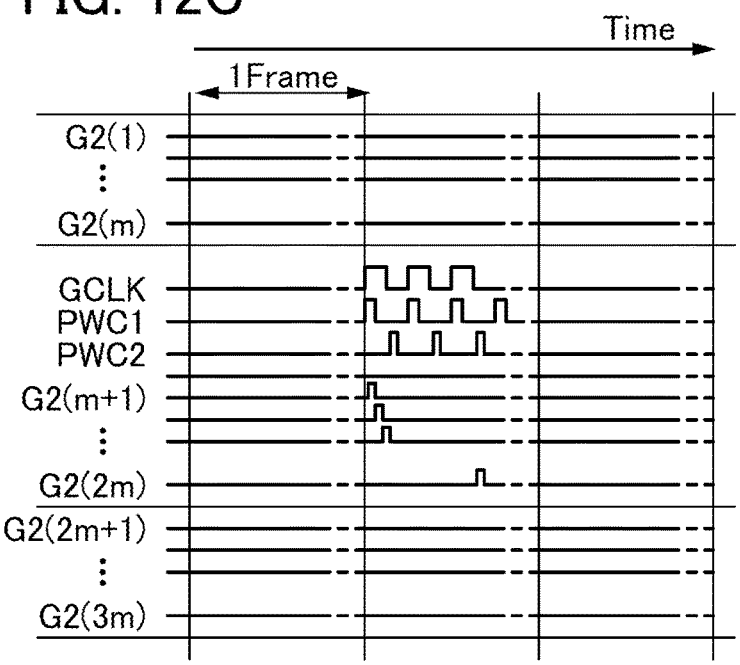

FIG. 12 shows a program of one embodiment of the present invention. FIG. 12(A) is a flow chart illustrating interrupt processing of the program of one embodiment of the present invention. FIG. 12(B) is a schematic view illustrating operation of the data processing device, and FIG. 12(C) is a timing chart illustrating operation of the data processing device of one embodiment of the present invention. Note that 1Frame in the drawing represents one frame, and Time written with an arrow represents a lapse of time.

<Structure Example 1 of Data Processing Device>

A data processing device described in this embodiment includes an arithmetic device 210 and an input/output device 220 (see FIG. 10(A)). Note that the input/output device is electrically connected to the arithmetic device 210. A data processing device 200 can also include a housing (see FIG. 10(B) or FIG. 10(C)).

<<Structure Example 1 of Arithmetic Device 210>>

The arithmetic device 210 is supplied with input data II or sensing data DS. The arithmetic device 210 generates the control data CI and the image data VI on the basis of the input data II or the sensing data DS and supplies the control data CI and the image data V1.

The arithmetic device 210 includes an arithmetic portion 211 and a memory portion 212. The arithmetic device 210 includes a transmission path 214 and an input/output interface 215.

The transmission path 214 is electrically connected to the arithmetic portion 211, the memory portion 212, and the input/output interface 215.

<<Arithmetic Portion 211>>

The arithmetic portion 211 has a function of executing a program, for example.

<<Memory Portion 212>>

The memory portion 212 has a function of storing, for example, the program executed by the arithmetic portion 211, initial data, setting data, an image, or the like.

Specifically, a hard disk, a flash memory, a memory using a transistor including an oxide semiconductor, or the like can be used.

<<Input/Output Interface 215 and Transmission Path 214>>

The input/output interface 215 includes a terminal or a wiring and has a function of supplying data and being supplied with data. The input/output interface 215 can be electrically connected to the transmission path 214, for example. The input/output interface 215 can also be electrically connected to the input/output device 220.

The transmission path 214 includes a wiring and has a function of supplying data and being supplied with data. The transmission path 214 can be electrically connected to the input/output interface 215, for example. The transmission path 214 can also be electrically connected to the arithmetic portion 211, the memory portion 212, or the input/output interface 215.

<<Structure Example of Input/Output Device 220>>

The input/output device 220 supplies the input data II and the sensing data DS. The input/output device 220 is supplied with the control data CI and the image data V1 (see FIG. 10(A)).

As the input data II, for example, a scan code of a keyboard, positional data, operation data of buttons, sound data, image data, or the like can be used. Alternatively, for example, illuminance data, attitude data, acceleration data, bearing data, pressure data, temperature data, humidity data, or the like of an environment where the data processing device 200 is used, or the like can be used as the sensing data DS.

As the control data CI, for example, a signal controlling the luminance of display of the image data V1, a signal controlling the color saturation, or a signal controlling the hue can be used. Alternatively, a signal that changes display of part of the image data V1 can be used as the control data CI.

The input/output device 220 includes the display portion 230, the input portion 240, and a sensing portion 250. For example, the input/output device described in Embodiment 4 can be used.

<<Structure Example of Display Portion 230>>

The display portion 230 displays the image data V1 on the basis of the control data CI.

The display portion 230 includes the control portion 238, the driver circuit GD, the driver circuit SD, and the display panel 700 (see FIG. 8). For example, the display device described in Embodiment 3 can be used for the display portion 230.

<<Structure Example of Input Portion 240>>

The input portion 240 generates the input data II. For example, the input portion 240 has a function of supplying positional data P1.

For example, a human interface or the like can be used for the input portion 240 (see FIG. 10(A)). Specifically, a keyboard, a mouse, a touch sensor, a microphone, a camera, or the like can be used as the input portion 240.

Moreover, a touch sensor including a region overlapping with the display portion 230 can be used. Note that an input/output device including the display portion 230 and a touch sensor including a region overlapping with the display portion 230 can be referred to as a touch panel or a touch screen.

A user can make various gestures (tap, drag, swipe, pinch in, and the like) using his/her finger touching the touch panel as a pointer, for example.

The arithmetic device 210, for example, analyzes data on the position, path, or the like of the finger in contact with the touch panel and can determine that a predetermined gesture is supplied when the analysis results meet predetermined conditions. Thus, the user can supply a predetermined operation instruction associated with the predetermined gesture in advance by using the gesture.

For instance, the user can supply a "scroll instruction" for changing the display position of image data by using a gesture of moving the finger in contact with the touch panel along the touch panel.

<<Structure Example of Sensing Portion 250>>

The sensing portion 250 generates the sensing data DS. The sensing portion 250 has a function of sensing the illuminance of the environment where the data processing device 200 is used and a function of supplying illuminance data, for example.

The sensing portion 250 has a function of sensing the ambient conditions and supplying the sensing data. Specifically, the sensing portion 250 can supply illuminance data, attitude data, acceleration data, bearing data, pressure data, temperature data, humidity data, or the like.

For example, a photosensor, an attitude sensor, an acceleration sensor, a direction sensor, a GPS (Global positioning System) signal receiving circuit, a pressure sensor, a temperature sensor, a humidity sensor, a camera, or the like can be used as the sensing portion 250.

<<Communication Portion 290>>

A communication portion 290 has a function of supplying data to a network and obtaining data from the network.

<<Housing>>

Note that the housing has a function of storing the input/output device 220 or the arithmetic device 210. Alternatively, the housing has a function of supporting the display portion 230 or the arithmetic device 210.

Thus, the control data can be generated on the basis of the input data or the sensing data. Alternatively, the image data can be displayed on the basis of the input data or the sensing data. Alternatively, the data processing device can determine the intensity of light received by the housing of the data processing device and operate under the environment where the data processing device is used. Alternatively, a user of the data processing device can select a display method. As a result, a novel data processing device that is highly convenient or reliable can be provided.

Note that in some cases, these components cannot be clearly distinguished from each other and one component may also serve as another component or include part of another component. For example, a touch panel in which a touch sensor overlaps with a display panel is an input portion as well as a display portion.

<<Structure Example 2 of Arithmetic Device 210>>

The arithmetic device 210 includes an artificial intelligence portion 213 (see FIG. 10(A)). The artificial intelligence portion 213 generates the control data CI on the basis of the input data II or the sensing data DS.

[Natural Language Processing on Input Data II]

Specifically, the artificial intelligence portion 213 can perform natural language processing on the input data II to extract one feature from the whole input data II. For example, the artificial intelligence portion 213 can infer emotion or the like put in the input data II, which can be a feature. The artificial intelligence portion 213 can infer the color, design, font, or the like empirically felt suitable for the feature. The artificial intelligence portion 213 can generate data specifying the color, design, or font of a letter or data specifying the color or design of the background, and the data can be used as the control data CI.

Specifically, the artificial intelligence portion 213 can perform natural language processing on the input data II to extract some words included in the input data II. For example, the artificial intelligence portion 213 can extract expressions including a grammatical error, a factual error, emotion, and the like. The artificial intelligence portion 213 can generate the control data CI for display of extracted part in the color, design, font, or the like different from those of another part, and the data can be used as the control data CI.

[Image Processing on Input Data II]

Specifically, the artificial intelligence portion 213 can perform image processing on the input data II to extract one feature from the input data II. For example, the artificial intelligence portion 213 can infer the age where an image of the input data II is taken, whether the image is taken indoors or outdoors, whether the image is taken in the daytime or at night, or the like, which can be a feature. The artificial intelligence portion 213 can infer the color tone empirically felt suitable for the feature and generate the control data CI for use of the color tone for display. Specifically, data specifying color (e.g., full color, monochrome, or sepia) used for expression of a gradation can be used as the control data CI.

Specifically, the artificial intelligence portion 213 can perform image processing on the input data II to extract some images included in the input data II. For example, the artificial intelligence portion 213 can generate the control data CI for display of a boundary between extracted part of the image and another part. Specifically, the artificial intelligence portion 213 can generate the control data CI for display of a rectangle surrounding the extracted part of the image.

[Inference Using Sensing Data DS]

Specifically, the artificial intelligence portion 213 can generate an inference using the sensing data DS. Alternatively, the artificial intelligence portion 213 can generate the control data CI on the basis of inference RI so that the user of the data processing device 200 can feel comfortable.

Specifically, the artificial intelligence portion 213 can generate the control data CI for adjustment of display brightness on the basis of the ambient illuminance or the like so that the display brightness can be felt comfortable. Alternatively, the artificial intelligence portion 213 can generate the control data CI for adjustment of volume on the basis of the ambient noise or the like so that the volume can be felt comfortable.

As the control data CI, a clock signal, a timing signal, or the like that is supplied to the control portion 238 included in the display portion 230 can be used. Alternatively, a clock signal, a timing signal, or the like that is supplied to a control portion 248 included in the input portion 240 can be used as the control data CI.

<Structure Example 2 of Data Processing Device>

Another structure of the data processing device of one embodiment of the present invention is described with reference to FIG. 11(A) and FIG. 11(B).

<<Program>>

A program of one embodiment of the present invention has the following steps (see FIG. 11(A)).

[First Step]

In a first step, setting is initialized (see FIG. 11(A) (S1)).

For example, predetermined image data which is to be displayed on start-up and data for determining a predetermined mode of displaying the image data and a predetermined display method for displaying the image data are acquired from the memory portion 212. Specifically, one still image data or another moving image data can be used as the predetermined image data. Furthermore, a first mode or a second mode can be used as the predetermined mode.

[Second Step]

In a second step, interrupt processing is allowed (see FIG. 11(A) (S2)). Note that an arithmetic device allowed to execute the interrupt processing can perform the interrupt processing in parallel with the main processing. The arithmetic device that has returned from the interrupt processing to the main processing can reflect the results obtained through the interrupt processing in the main processing.

The arithmetic device may execute the interrupt processing when a counter has an initial value, and the counter may be set at a value other than the initial value when the arithmetic device returns from the interrupt processing. Thus, the interrupt processing can always follow the start-up of the program.

[Third Step]

In a third step, image data is displayed by a predetermined mode or a predetermined display method selected in the first step or the interrupt processing (see FIG. 11(A) (S3)). Note that the predetermined mode determines a mode of displaying the data, and the predetermined display method determines a method for displaying the image data. For example, the image data V1 can be used as data to be displayed.

One method for displaying the image data V1 can be associated with the first mode, for example. Alternatively, another method for displaying the image data V1 can be associated with the second mode. Thus, a display method can be selected on the basis of the selected mode.

<<First Mode>>

Specifically, a method for supplying selection signals to a scan line at a frequency of 30 Hz or higher, preferably 60 Hz or higher, and performing display on the basis of the selection signals can be associated with the first mode.

For example, when selection signals are supplied at a frequency of 30 Hz or higher, preferably 60 Hz or higher, the movement of a moving image can be smoothly displayed.

For example, when an image is refreshed at a frequency of 30 Hz or higher, preferably 60 Hz or higher, an image that changes so as to smoothly follow the user's operation can be displayed on the data processing device 200 which is being operated by the user.

<<Second Mode>>

Specifically, a method for supplying selection signals to a scan line at a frequency lower than 30 Hz, preferably lower than 1 Hz, further preferably less than once a minute, and performing display on the basis of the selection signals can be associated with the second mode.

The supply of selection signals at a frequency lower than 30 Hz, preferably lower than 1 Hz, further preferably less than once a minute enables display with a flicker or flickering suppressed. Furthermore, the power consumption can be reduced.

For example, when the data processing device 200 is used for a clock, the display can be refreshed at a frequency of once a second, once a minute, or the like.

Note that when a light-emitting element is used as the display element, for example, the light-emitting element can be made to emit light in a pulsed manner so that image data is displayed. Specifically, an organic EL element can be made to emit light in a pulsed manner, and its afterglow can be used for display. The organic EL element has excellent frequency characteristics; thus, time for driving the light-emitting element can be shortened, and thus the power consumption can be reduced in some cases. Alternatively, heat generation is inhibited; thus, the deterioration of the light-emitting element can be suppressed in some cases.

[Fourth Step]

In a fourth step, selection is performed such that the program proceeds to a fifth step when a termination instruction has been supplied, whereas the program proceeds to the third step when the termination instruction has not been supplied (see FIG. 11(A) (S4)).

For example, the termination instruction supplied in the interrupt processing may be used for the determination.

[Fifth Step]

In the fifth step, the program terminates (see FIG. 11(A) (S5)).

<<Interrupt Processing>>

The interrupt processing includes a sixth step to an eighth step described below (see FIG. 11(B)).

[Sixth Step]

In the sixth step, the illuminance of the environment where the data processing device 200 is used is sensed using the sensing portion 250, for example (see FIG. 11(B) (S6)). Note that color temperature or chromaticity of ambient light may be sensed instead of the illuminance of the environment.

[Seventh Step]

In the seventh step, a display method is determined on the basis of the sensed illuminance data (see FIG. 11(B) (S7)). For example, a display method is determined such that the brightness of display is not too dark or too bright.

Note that in the case where the color temperature of the ambient light or the chromaticity of the ambient light is sensed in the sixth step, the color of display may be adjusted.

[Eighth Step]

In the eighth step, the interrupt processing terminates (see FIG. 11(B) (S8)).

<Structure Example 3 of Data Processing Device>

Another structure of the data processing device of one embodiment of the present invention is described with reference to FIG. 12.

FIG. 12(A) is a flow chart illustrating a program of one embodiment of the present invention. FIG. 12(A) is a flow chart illustrating interrupt processing different from the interrupt processing shown in FIG. 11(B).

Note that the structure example 3 of the data processing device is different from the interrupt processing described with reference to FIG. 11(B) in that the interrupt processing includes a step of changing a mode on the basis of a supplied predetermined event. Different portions will be described in detail here, and refer to the above description for portions that can use similar structures.

<<Interrupt Processing>>

The interrupt processing includes a sixth step to an eighth step described below (see FIG. 12(A)).

[Sixth Step]

In the sixth step, the program proceeds to the seventh step when a predetermined event has been supplied, whereas the program proceeds to the eighth step when the predetermined event has not been supplied (see FIG. 12(A) (U6)). For example, whether the predetermined event is supplied in a predetermined period or not can be used as a condition. Specifically, the predetermined period can be longer than 0 seconds, and shorter than or equal to 5 seconds, shorter than or equal to 1 second, or shorter than or equal to 0.5 seconds, preferably shorter than or equal to 0.1 seconds.

[Seventh Step]

In the seventh step, the mode is changed (see FIG. 12(A) (U7)). Specifically, the second mode is selected in the case where the first mode has been selected, and the first mode is selected in the case where the second mode has been selected.

For example, it is possible to change the display mode of a region that is part of the display portion 230. Specifically, the display mode of a region where one driver circuit in the display portion 230 including the driver circuit GDA, the driver circuit GDB, and a driver circuit GDC supplies a selection signal can be changed (see FIG. 12(B)).

For example, the display mode of the region where a selection signal is supplied from the driver circuit GDB can be changed when a predetermined event is supplied to the input portion 240 in a region overlapping with the region where a selection signal is supplied from the driver circuit GDB (see FIG. 12(B) and FIG. 12(C)). Specifically, the frequency of supply of the selection signal from the driver circuit GDB can be changed in accordance with a "tap" event supplied to a touch panel with a finger or the like.

A signal GCLK is a clock signal controlling the operation of the driver circuit GDB, and a signal PWC1 and a signal PWC2 are pulse width control signals controlling the operation of the driver circuit GDB. The driver circuit GDB supplies selection signals to a scan line G21($m$+1) to a scan line G21($2m$) on the basis of the signal GCLK, the signal PWC1, the signal PWC2, and the like.

Thus, for example, the driver circuit GDB can supply a selection signal without supply of selection signals from the driver circuit GDA and the driver circuit GDC. Alternatively, the display of the region where a selection signal is supplied from the driver circuit GDB can be refreshed without any change in the display of regions where selection signals are supplied from the driver circuit GDA and the driver circuit GDC. Alternatively, power consumed by the driver circuits can be reduced.

[Eighth Step]

In the eighth step, the interrupt processing terminates (see FIG. 12(A) (U8)). Note that in a period in which the main processing is executed, the interrupt processing may be repeatedly executed.

<<Predetermined Event>>

For example, it is possible to use events supplied using a pointing device such as a mouse, such as "click" and "drag", and events supplied to a touch panel with a finger or the like used as a pointer, such as "tap", "drag", and "swipe".

For example, the position of a slide bar pointed by a pointer, the swipe speed, and the drag speed can be used to assign arguments to an instruction associated with a predetermined event.

For example, data sensed by the sensing portion 250 is compared with a predetermined threshold value, and the compared results can be used for the event.

Specifically, a pressure sensor or the like in contact with a button or the like that is arranged so as to be pushed in a housing can be used for the sensing portion 250.

<<Instruction Associated with Predetermined Event>>

For example, the termination instruction can be associated with a predetermined event.

For example, "page-turning instruction" for switching display from one displayed image data to another image data can be associated with a predetermined event. Note that an argument determining the page-turning speed or the like, which is used when the "page-turning instruction" is executed, can be supplied using the predetermined event.

For example, "scroll instruction" for moving the display position of displayed part of image data and displaying another part continuing from that part, or the like can be associated with a predetermined event. Note that an argument determining the moving speed of display, or the like, which is used when the "scroll instruction" is executed, can be supplied using the predetermined event.

For example, an instruction for setting the display method, an instruction for generating image data, or the like can be associated with a predetermined event. Note that an argument determining the brightness of a generated image can be associated with a predetermined event. An argument determining the brightness of a generated image may be determined on the basis of ambient brightness sensed by the sensing portion 250.

For example, an instruction for acquiring data distributed via a push service using the communication portion 290 or the like can be associated with a predetermined event.

Note that positional data sensed by the sensing portion 250 may be used for the determination of the presence or absence of a qualification for acquiring data. Specifically, it may be determined that there is a qualification for acquiring data in the case of presence in a predetermined class room, school, conference room, company, building, or the like or in a predetermined region. Thus, for example, educational materials distributed in a classroom of a school, a university, or the like can be received, so that the data processing device 200 can be used as a schoolbook or the like (see FIG. 10(C)). Alternatively, materials distributed in a conference room in, for example, a company can be received and used for a conference material.

Note that this embodiment can be combined with other embodiments in this specification as appropriate.

Embodiment 6

In this embodiment, structures of a data processing device of one embodiment of the present invention are described with reference to FIG. 13 and FIG. 14.

FIG. 13 and FIG. 14 show structures of the data processing device of one embodiment of the present invention. FIG. 13(A) is a block diagram of the data processing device, and FIG. 13(B) to FIG. 13(E) are perspective views illustrating structures of the data processing device. FIG. 14(A) to FIG. 14(E) are perspective views illustrating structures of the data processing device.

<Data Processing Device>

Figure 13A:
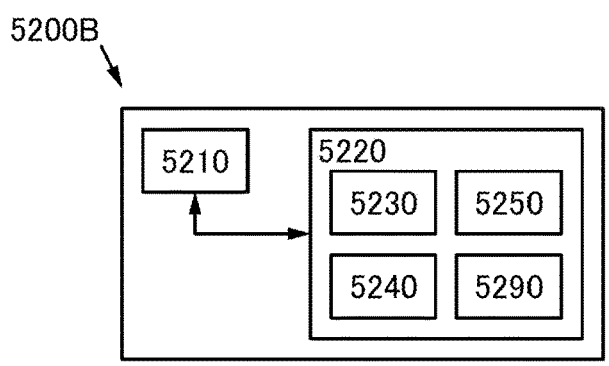
FIG. 13(A) to (E) Diagrams each illustrating a structure of a data processing device of an embodiment.

A data processing device 5200B described in this embodiment includes an arithmetic device 5210 and an input/output device 5220 (see FIG. 13(A)).

The arithmetic device 5210 has a function of being supplied with operation data and a function of supplying image data on the basis of the operation data.

The input/output device 5220 includes a display portion 5230, an input portion 5240, a sensing portion 5250, and a communication portion 5290 and has a function of supplying operation data and a function of being supplied with image data. The input/output device 5220 also has a function of supplying sensing data, a function of supplying communication data, and a function of being supplied with communication data.

The input portion 5240 has a function of supplying operation data. For example, the input portion 5240 supplies operation data on the basis of operation by a user of the data processing device 5200B.

Specifically, a keyboard, a hardware button, a pointing device, a touch sensor, an illuminance sensor, an imaging device, an audio input device, an eye-gaze input device, an attitude sensing device, or the like can be used as the input portion 5240.

The display portion 5230 includes a display panel and has a function of displaying image data. For example, the display panel described in Embodiment 1 or Embodiment 2 can be used for the display portion 5230.

The sensing portion 5250 has a function of supplying sensing data. For example, the sensing portion 5250 has a function of sensing a surrounding environment where the data processing device is used and supplying sensing data.

Specifically, an illuminance sensor, an imaging device, an attitude sensing device, a pressure sensor, a human motion sensor, or the like can be used as the sensing portion 5250.

The communication portion 5290 has a function of being supplied with communication data and a function of supplying communication data. For example, the communication portion 5290 has a function of being connected to another electronic device or a communication network through wireless communication or wired communication. Specifically, the communication portion 5290 has a function of wireless local area network communication, telephone communication, or near field communication, for example.

<<Structure Example 1 of Data Processing Device>>

Figure 13B:
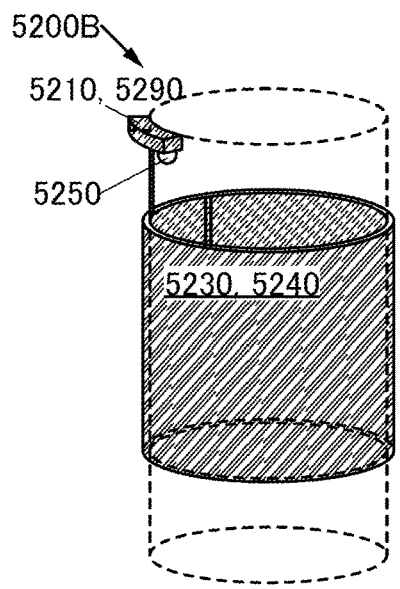

For example, the display portion 5230 can have an outer shape along a cylindrical column or the like (see FIG. 13(B)). The data processing device has a function of changing its display method in accordance with the illuminance of a usage environment. In addition, the data processing device has a function of changing the displayed content in response to sensed existence of a person. This allows the data processing device to be provided on a column of a building, for example. The data processing device can display advertising, guidance, or the like. The data processing device can be used for digital signage or the like.

<<Structure Example 2 of Data Processing Device>>

Figure 13C:
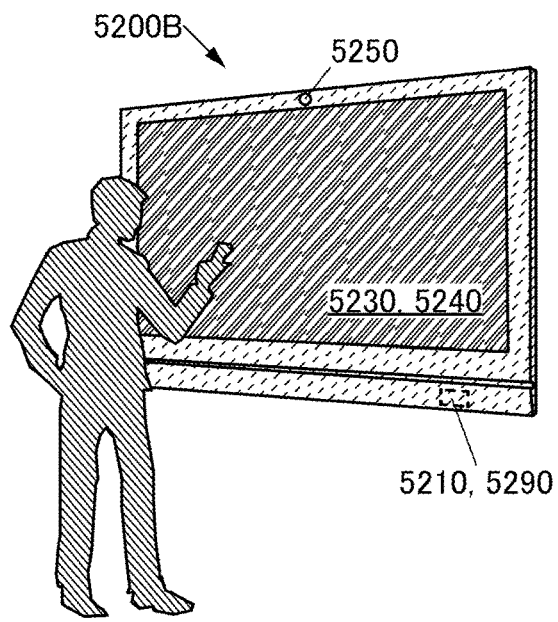

For example, the data processing device has a function of generating image data on the basis of the path of a pointer used by a user (see FIG. 13(C)). Specifically, the display panel with a diagonal size of 20 inches or longer, preferably 40 inches or longer, further preferably 55 inches or longer can be used. Alternatively, a plurality of display panels can be arranged and used as one display region. Alternatively, a plurality of display panels can be arranged and used as a multiscreen. Thus, the data processing device can be used for an electronic blackboard, an electronic bulletin board, or digital signage, for example.

<<Structure Example 3 of Data Processing Device>>

Figure 13D:
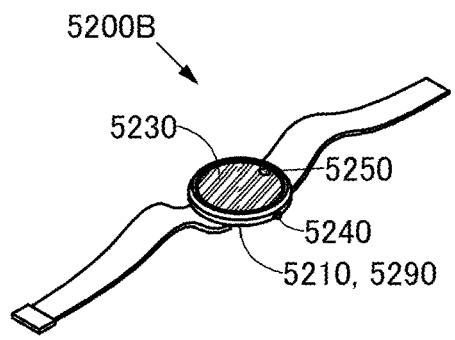

For example, the data processing device has a function of changing its display method in accordance with the illuminance of a usage environment (see FIG. 13(D)). Thus, for example, the power consumption of a smartwatch can be reduced. Alternatively, for example, a smartwatch can display an image so as to be suitably used even in an environment under strong external light, e.g., outdoors in fine weather.

<<Structure Example 4 of Data Processing Device>>

Figure 13E:
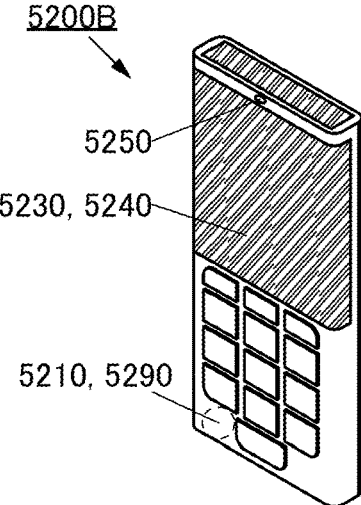

For example, the display portion 5230 has a surface gently curved along a side surface of a housing (see FIG. 13(E)). The display portion 5230 includes a display panel that has a function of displaying an image on the front surface, the side surfaces, and the top surface, for example. Thus, for example, a mobile phone can display image data not only on its front surface but also on its side surfaces and top surface.

<<Structure Example 5 of Data Processing Device>>

Figure 14A:
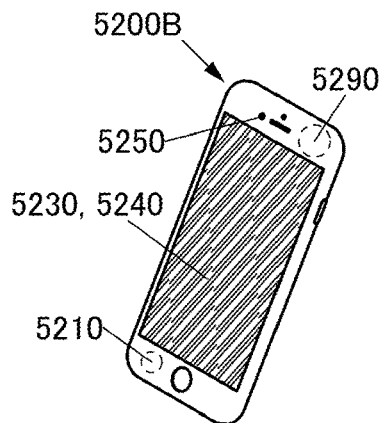
FIG. 14(A) to (E) Diagrams each illustrating a structure of a data processing device of an embodiment.

For example, the data processing device has a function of changing its display method in accordance with the illuminance of a usage environment (see FIG. 14(A)). Thus, the power consumption of a smartphone can be reduced. Alternatively, for example, a smartphone can display an image so as to be suitably used even in an environment under strong external light, e.g., outdoors in fine weather.

<<Structure Example 6 of Data Processing Device>>

Figure 14B:
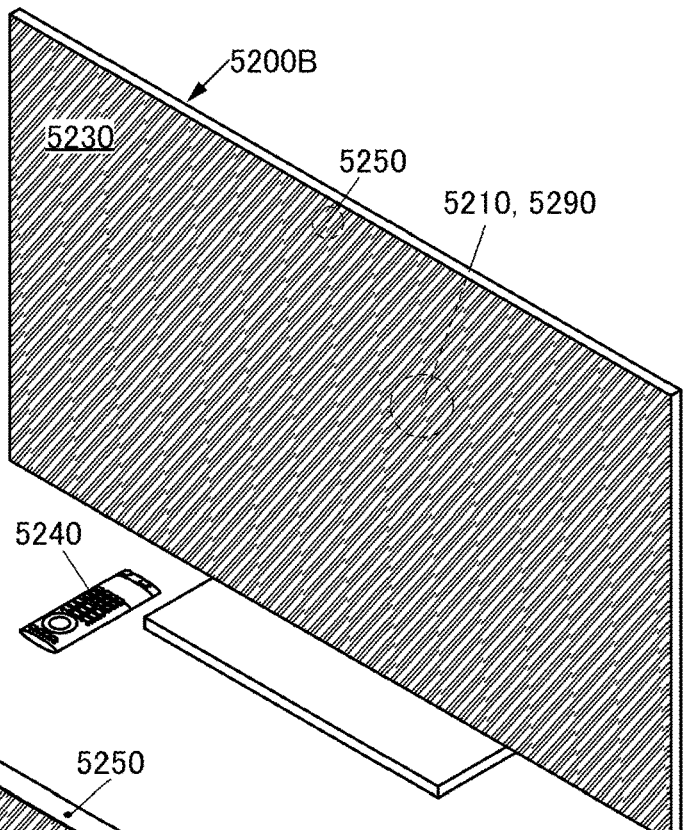

For example, the data processing device has a function of changing its display method in accordance with the illuminance of a usage environment (see FIG. 14(B)). Accordingly, a television system can display an image in such a manner that the television system can be suitably used even when irradiated with strong external light that enters the room from the outside in fine weather.

<<Structure Example 7 of Data Processing Device>>

Figure 14C:
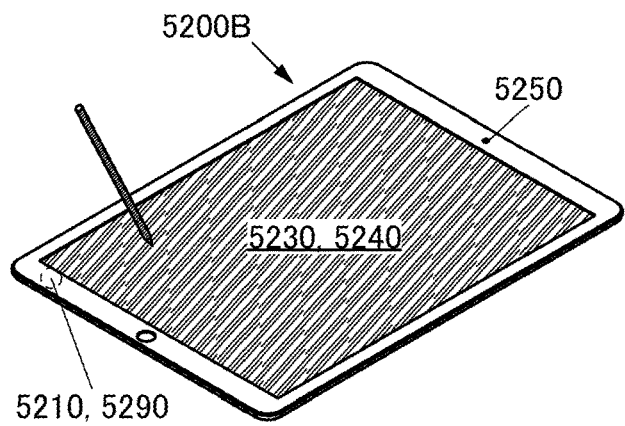

For example, the data processing device has a function of changing its display method in accordance with the illuminance of a usage environment (see FIG. 14(C)). Thus, for example, a tablet computer can display an image so as to be suitably used even in an environment under strong external light, e.g., outdoors in fine weather.

<<Structure Example 8 of Data Processing Device>>

Figure 14D:
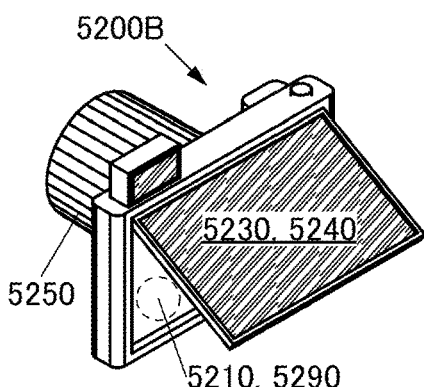

For example, the data processing device has a function of changing its display method in accordance with the illuminance of a usage environment (see FIG. 14(D)). Accordingly, for example, a digital camera can display a subject in such a manner that an image is favorably viewed even in an environment under strong external light, e.g., outdoors in fine weather.

<<Structure Example 9 of Data Processing Device>>

Figure 14E:
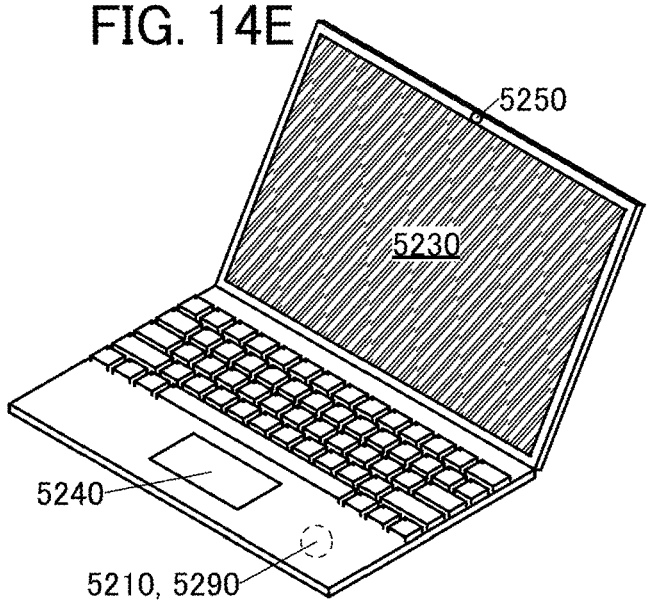

For example, the data processing device has a function of changing its display method in accordance with the illuminance of a usage environment (see FIG. 14(E)). Accordingly, for example, a personal computer can display an image so as to be suitably used even in an environment under strong external light, e.g., outdoors in fine weather.

Note that this embodiment can be combined with other embodiments in this specification as appropriate.

In the case where there is an explicit description, X and Y are connected, in this specification and the like, for example, the case where X and Y are electrically connected, the case where X and Y are functionally connected, and the case where X and Y are directly connected are disclosed in this specification and the like. Accordingly, without being limited to a predetermined connection relation, for example, a connection relation shown in drawings or text, a connection relation other than one shown in drawings or text is regarded as being disclosed in the drawings or the text.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y (e.g., a switch, a transistor, a capacitor, an inductor, a resistor, a diode, a display element, a light-emitting element, and a load) provided therebetween.

An example of the case where X and Y are electrically connected is the case where one or more elements that allow an electrical connection between X and Y (e.g., a switch, a transistor, a capacitor, an inductor, a resistor, a diode, a display element, a light-emitting element, and a load) can be connected between X and Y. Note that a switch has a function of being controlled to be turned on or off. That is, a switch has a function of being in a conducting state (on state) or a non-conducting state (off state) to control whether or not current flows. Alternatively, the switch has a function of selecting and changing a current path. Note that the case where X and Y are electrically connected includes the case where X and Y are directly connected.

An example of the case where X and Y are functionally connected is the case where one or more circuits that allow a functional connection between X and Y (for example, a logic circuit (an inverter, a NAND circuit, a NOR circuit, or the like), a signal converter circuit (a DA converter circuit, an AD converter circuit, a gamma correction circuit, or the like), a potential level converter circuit (a power supply circuit (for example, a step-up circuit, a step-down circuit, or the like), a level shifter circuit for changing the potential level of a signal, or the like), a voltage source, a current source, a switching circuit, an amplifier circuit (a circuit capable of increasing signal amplitude, the amount of current, or the like, an operational amplifier, a differential amplifier circuit, a source follower circuit, a buffer circuit, or the like), a signal generator circuit, a memory circuit, a control circuit, or the like) can be connected between X and Y. For example, even when another circuit is interposed between X and Y, X and Y are functionally connected when a signal output from X is transmitted to Y. Note that the case where X and Y are functionally connected includes the case where X and Y are directly connected and the case where X and Y are electrically connected.

Note that in the case where there is an explicit description, X and Y are electrically connected, the case where X and Y are electrically connected (i.e., the case where X and Y are connected with another element or another circuit interposed therebetween), the case where X and Y are functionally connected (i.e., the case where X and Y are functionally connected with another circuit interposed therebetween), and the case where X and Y are directly connected (i.e., the case where X and Y are connected without another element or another circuit interposed therebetween) are disclosed in this specification and the like. That is, in the case where there is an explicit description, being electrically connected, the same contents as the case where there is only an explicit description, being connected, are disclosed in this specification and the like.

Note that, for example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y can be expressed as follows.

Examples of the expressions include "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided in this connection order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path through the transistor and between the source (or the first terminal or the like) of the transistor and a drain (or a second terminal or the like) of the transistor, the first connection path is a path through Z1, the drain (or the second terminal or the like) of the transistor is electrically connected to Y through at least a third connection path, the third connection path does not include the second connection path, and the third connection path is a path through Z2" and "a source (or a first terminal or the like) of a transistor is electrically connected to X through Z1 by at least a first connection path, the first connection path does not include a second connection path, the second connection path includes a connection path through the transistor, a drain (or a second terminal or the like) of the transistor is electrically connected to Y through Z2 by at least a third connection path, and the third connection path does not include the second connection path". Still another example of the expression is "a source (or a first terminal or the like) of a transistor is electrically connected to X through Z1 by at least a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through Z2 by at least a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and the expression is not limited to these expressions. Here, X, Y, Z1, and Z2 denote an object (e.g., a device, an element, a circuit, a wiring, an electrode, a terminal, a conductive film, and a layer).

Even when a circuit diagram shows that independent components are electrically connected to each other, one component has functions of a plurality of components in some cases. For example, when part of a wiring also functions as an electrode, one conductive film has functions of both components: a function of the wiring and a function of the electrode. Thus, the electrical connection in this specification includes in its category such a case where one conductive film has functions of a plurality of components.

REFERENCE NUMERALS

ACF1: conductive material, ANO: conductive film, CC: color conversion layer, CF: absorption layer, CI: control data, CP: conductive material, C21: capacitor, C22: capacitor, DS: sensing data, G21: scan line, GCLK: signal, h1: light, h2: light, h3: light, h4: light, II: input data, N1: node, P1: positional data, PWC1: signal, PWC2: signal, S21: signal line, SP: control signal, SW21: switch, SW22: switch, VI: image data, V1: image data, V11: data, VCOM2: conductive film, 200: data processing device, 210: arithmetic device, 211: arithmetic portion, 212: memory portion, 213: artificial intelligence portion, 214: transmission path, 215: input/output interface, 220: input/output device, 230: display portion, 231: display region, 233: control circuit, 234: decompression circuit, 235: image processing circuit, 238: control portion, 240: input portion, 241: sensing region, 248: control portion, 250: sensing portion, 290: communication portion, 400: molecular weight, 501C: insulating film, 501D: insulating film, 504: conductive film, 506: insulating film, 508: semiconductor film, 508A: region, 508B: region, 508C: region, 510: base material, 512A: conductive film, 512B: conductive film, 516: insulating film, 518: insulating film, 519B: terminal, 520: functional layer, 521: insulating film, 524: conductive film, 528: insulating film, 530: pixel circuit, 541: bonding layer, 544: terminal, 550: display element, 551: electrode, 552: electrode, 553: layer, 573: insulating film, 573A: insulating film, 573B: insulating film, 591A: opening portion, 650: display element, 700: display panel, 700TP: input/output panel, 702: pixel, 703: pixel, 705: sealant, 720: functional layer, 770: base material, 770P: functional film, 771: insulating film, 775: sensing element, 5200B: data processing device, 5210: arithmetic device, 5220: input/output device, 5230: display portion, 5240: input portion, 5250: sensing portion, 5290: communication portion This application is based on Japanese Patent Application Serial No. 2018-108641 filed with Japan Patent Office on Jun. 6, 2018, the entire contents of which are hereby incorporated herein by reference.

The invention claimed is:

1. A light-emitting device comprising:
a first display element;
a second display element;
a third display element;
a first color conversion layer;
a second color conversion layer;
a first absorption layer;
a second absorption layer; and
an insulating film,
wherein the first absorption layer and the first display element overlap with each other with the first color conversion layer interposed between the first absorption layer and the first display element,
wherein the second absorption layer and the second display element overlap with each other with the second color conversion layer interposed between the second absorption layer and the second display element,
wherein each of the first display element, the second display element, and the third display element comprises a first light-emitting unit, a second light-emitting unit, and an intermediate layer between the first light-emitting unit and the second light-emitting unit,
wherein the first light-emitting unit comprises a material that emits blue light,
wherein the second light-emitting unit comprises the material that emits blue light,
wherein each of the first display element, the second display element, and the third display element emits first light,
wherein the first color conversion layer converts the first light into second light,
wherein the second color conversion layer converts the first light into third light,
wherein the first light emitted from the third display element does not enter a color conversion layer,
wherein a wavelength of the second light is longer than a wavelength of the first light,
wherein a wavelength of the third light is longer than the wavelength of the first light, and
wherein the insulating film is between the first color conversion layer and the second color conversion layer.

2. The light-emitting device according to claim 1, wherein the light-emitting device is a top emission light-emitting device.

3. The light-emitting device according to claim 1, wherein the insulating film comprises fluorine or silicon.

4. The light-emitting device according to claim 1, further comprising a base material over the first absorption layer and the second absorption layer.

5. The light-emitting device according to claim 1, further comprising a light-blocking film between the first absorption layer and the second absorption layer.

6. The light-emitting device according to claim 5, wherein the light-blocking film and the insulating film overlap with each other.

7. The light-emitting device according to claim 1, further comprising a film over the first absorption layer and the second absorption layer,
wherein a reflectivity of the film is 0.5% or less.

8. The light-emitting device according to claim 1,
wherein the first absorption layer absorbs the first light, and
wherein the second absorption layer absorbs the first light.

9. The light-emitting device according to claim 1,
wherein the first color conversion layer comprises a first quantum dot, and
wherein the second color conversion layer comprises a second quantum dot.

10. A light-emitting device comprising:
a first display element;
a second display element;
a third display element;
a first color conversion layer;
a second color conversion layer;
a first absorption layer;
a second absorption layer; and
an insulating film,
wherein the first absorption layer and the first display element overlap with each other with the first color conversion layer interposed between the first absorption layer and the first display element,
wherein the second absorption layer and the second display element overlap with each other with the second color conversion layer interposed between the second absorption layer and the second display element,
wherein each of the first display element, the second display element, and the third display element comprises a first light-emitting unit, a second light-emitting unit, and an intermediate layer between the first light-emitting unit and the second light-emitting unit,
wherein the first light-emitting unit comprises a material that emits blue light,
wherein the second light-emitting unit comprises the material that emits blue light,
wherein each of the first display element, the second display element, and the third display element emits first light, wherein the first color conversion layer converts the first light into second light, wherein the second color conversion layer converts the first light into third light, wherein the first light emitted from the third display element does not enter a color conversion layer, wherein a color of the second light has a chromaticity x of greater than or equal to 0.130 and less than or equal to 0.250 and a chromaticity y of greater than 0.710 and less than or equal to 0.810 in the CIE 1931 chromaticity coordinate, wherein a color of the third light has a chromaticity x of greater than 0.680 and less than or equal to 0.720 and a chromaticity y of greater than or equal to 0.260 and less than or equal to 0.320 in the CIE 1931 chromaticity coordinates, wherein a color of the first light has a chromaticity x of greater than or equal to 0.120 and less than or equal to 0.170 and a chromaticity y of greater than or equal to 0.020 and less than 0.060 in the CIE 1931 chromaticity coordinates, and wherein the insulating film is between the first color conversion layer and the second color conversion layer.

11. The light-emitting device according to claim 10, wherein the light-emitting device is a top emission light-emitting device.

12. The light-emitting device according to claim 10, wherein the insulating film comprises fluorine or silicon.

13. The light-emitting device according to claim 10, further comprising a base material over the first absorption layer and the second absorption layer.

14. The light-emitting device according to claim 10, further comprising a light-blocking film between the first absorption layer and the second absorption layer.

15. The light-emitting device according to claim 14, wherein the light-blocking film and the insulating film overlap with each other.

16. The light-emitting device according to claim 10, further comprising a film over the first absorption layer and the second absorption layer,
wherein a reflectivity of the film is 0.5% or less.

17. The light-emitting device according to claim 10,
wherein the first absorption layer absorbs the first light, and
wherein the second absorption layer absorbs the first light.

18. The light-emitting device according to claim 10,
wherein the first color conversion layer comprises a first quantum dot, and
wherein the second color conversion layer comprises a second quantum dot.

* * * * *